(12) United States Patent
Fishburn

(10) Patent No.: US 8,395,941 B2
(45) Date of Patent: Mar. 12, 2013

(54) MULTI-SEMICONDUCTOR MATERIAL VERTICAL MEMORY STRINGS, STRINGS OF MEMORY CELLS HAVING INDIVIDUALLY BIASABLE CHANNEL REGIONS, MEMORY ARRAYS INCORPORATING SUCH STRINGS, AND METHODS OF ACCESSING AND FORMING THE SAME

(75) Inventor: Fred Fishburn, Woodbridge, VA (US)

(73) Assignee: Micron Technology, Inc., Boise, ID (US)

( * ) Notice: Subject to any disclaimer, the term of this patent is extended or adjusted under 35 U.S.C. 154(b) by 380 days.

(21) Appl. No.: 12/781,346

(22) Filed: May 17, 2010

(65) Prior Publication Data
US 2011/0280077 A1    Nov. 17, 2011

(51) Int. Cl.
*G11C 16/04*    (2006.01)
(52) U.S. Cl. ............... 365/185.17; 365/185.18
(58) Field of Classification Search ............ 365/185.18, 365/185.17
See application file for complete search history.

(56) References Cited

U.S. PATENT DOCUMENTS

| | | | |
|---|---|---|---|
| 7,098,122 B2 | 8/2006 | Gonzalez | |
| 7,279,739 B2 | 10/2007 | Kanegae et al. | |
| 7,294,549 B2 | 11/2007 | Rudeck | |
| 2008/0002475 A1 | 1/2008 | Yang et al. | |
| 2008/0179659 A1 | 7/2008 | Enda et al. | |
| 2009/0039407 A1 | 2/2009 | Vora | |
| 2009/0117697 A1 | 5/2009 | Park et al. | |
| 2009/0121271 A1* | 5/2009 | Son et al. | 257/315 |
| 2009/0230461 A1 | 9/2009 | Lee | |
| 2009/0258464 A1* | 10/2009 | Camillo-Castillo et al. | 438/150 |
| 2010/0109097 A1* | 5/2010 | Zhang et al. | 257/408 |

* cited by examiner

*Primary Examiner* — Huan Hoang
(74) *Attorney, Agent, or Firm* — Leffert Jay & Polglaze, P.A.

(57) ABSTRACT

Multi-semiconductor vertical memory strings, strings of memory cells having individually biasable channel regions, arrays incorporating such strings and methods for forming and accessing such strings are provided. For example non-volatile memory devices are disclosed that utilize NAND strings of serially-connected non-volatile memory cells. One such string can include two or more serially connected non-volatile memory cells each having a channel region. Each memory cell of the two or more serially connected non-volatile memory cells shares a common control gate and each memory cell of the two or more serially connected non-volatile memory cells is configured to receive an individual bias to its channel region.

40 Claims, 23 Drawing Sheets

US 8,395,941 B2

MULTI-SEMICONDUCTOR MATERIAL VERTICAL MEMORY STRINGS, STRINGS OF MEMORY CELLS HAVING INDIVIDUALLY BIASABLE CHANNEL REGIONS, MEMORY ARRAYS INCORPORATING SUCH STRINGS, AND METHODS OF ACCESSING AND FORMING THE SAME

TECHNICAL FIELD

The present disclosure relates generally to semiconductor memories and, in particular, in one or more embodiments, the present disclosure relates to NAND memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage nodes (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged and accessed. Typically, the array of memory cells for NAND flash memory devices is arranged such that memory cells of a string are connected together in series, source to drain.

To meet demands for higher capacity memories, designers continue to strive for increasing memory density, i.e., the number of memory cells for a given area of an integrated circuit die. One way to increase density is to reduce the feature size of individual memory cells. However, as device size decreases, the thickness of the tunnel dielectric layer must also generally decrease. This, in turn, results in increasing risk of failure in the tunnel dielectric and charge leakage from the storage node. Alternatively, memory density can be increased by stacking multiple layers of memory arrays on top of one another. However, forming semiconductor layers of sufficient quality to serve as active areas of the arrays becomes problematic and costly. Another proposal has been to form NAND arrays vertically around semiconductor pillars, which act as the channel regions of the NAND strings.

For the reasons stated above, and for other reasons stated below which will become apparent to those skilled in the art upon reading and understanding the present specification, there is a need in the art for alternative memory device architectures.

DETAILED DESCRIPTION

Figure 1:
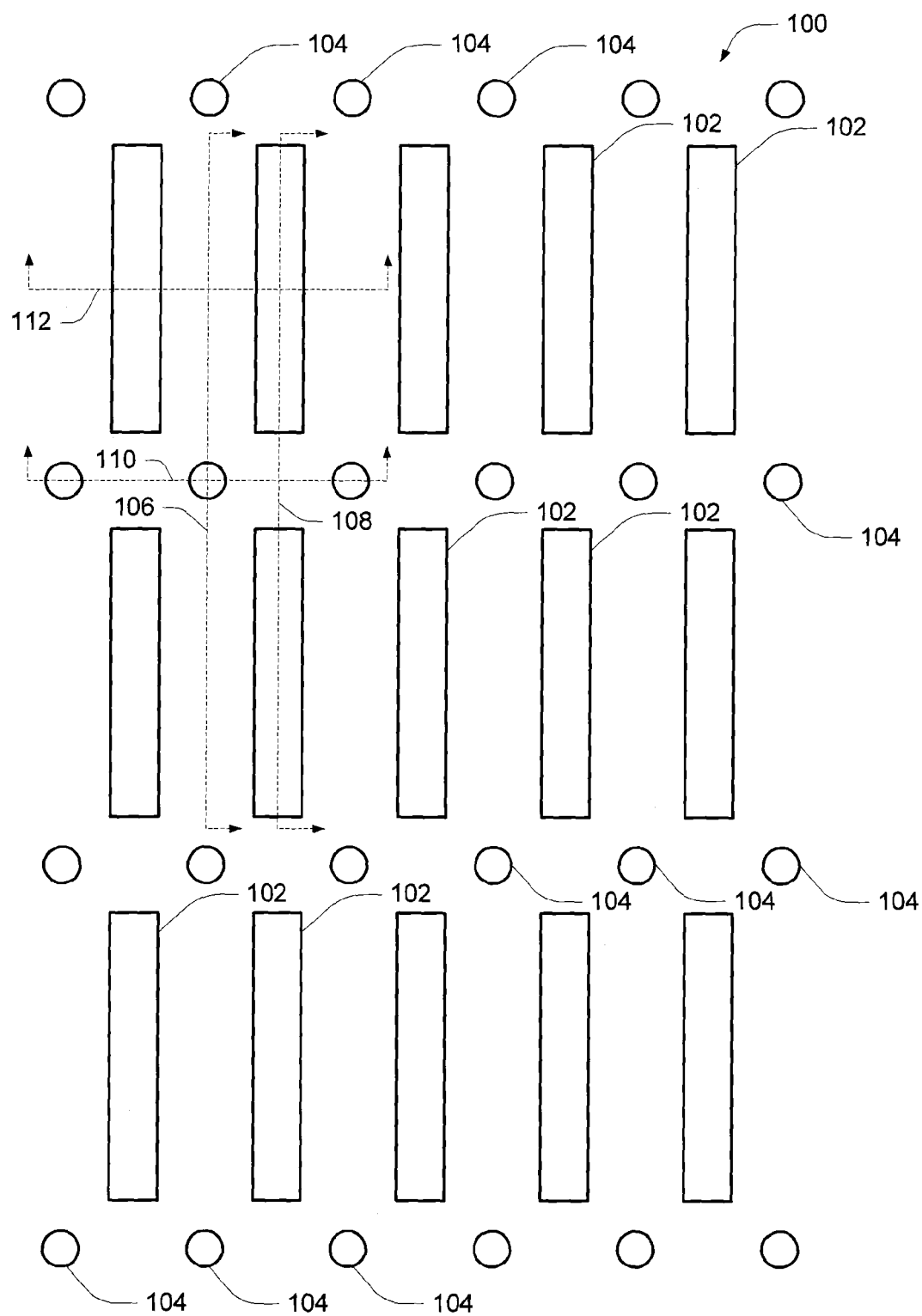
FIG. 1 is top view of a portion of a memory array in accordance with an embodiment to provide frames of reference for the discussion of FIGS. 2-7D.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The term semiconductor can refer to, for example, a layer of material, a wafer, or a substrate, and includes any base semiconductor structure. "Semiconductor" is to be understood as including silicon on sapphire (SOS) technology, silicon on insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure. The following detailed description is, therefore, not to be taken in a limiting sense.

Various embodiments describe herein include memory utilizing a vertical structure of strings of memory cells (e.g., NAND strings of memory cells). In stark contrast to typical vertical NAND structures, memory cells of a NAND string of an embodiment described herein share not a common channel region, but a common control gate. Because each memory cell of a NAND string in accordance with the embodiments shares a common control gate, selective activation of individual memory cells of the NAND string is controlled by individually biasing channel regions of the memory cells of the NAND string.

FIG. 1 is top view of a portion of a memory array 100 (e.g., a NAND memory array) to provide reference to subsequent figures describing methods of forming a vertical structure in accordance with various embodiments. Shown in FIG. 1 are isolation regions 102 and access holes 104 which will provide frames of reference in describing the subsequent figures.

Figure 2:
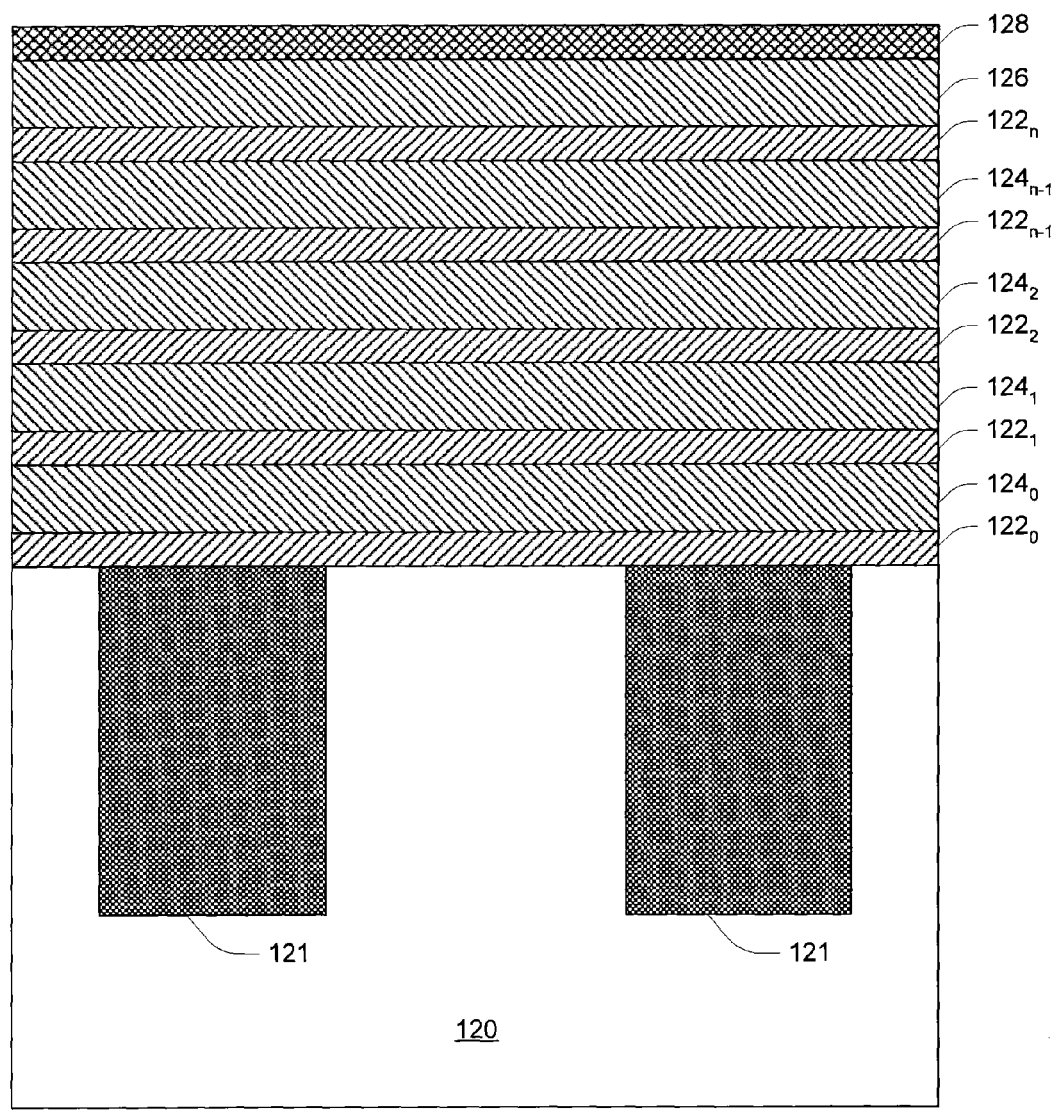
FIG. 2 is a cross-sectional view of a portion of the memory array of FIG. 1 in accordance with one embodiment.

FIGS. 2-7D depict a portion of a memory array during various stages of fabrication. FIG. 2 depicts a portion of a memory array after several processing steps have occurred. FIG. 2 is a cross-sectional view taken along view line 106 of FIG. 1. In general, FIG. 2 may depict a semiconductor 120 upon which portions of future strings of memory cells are formed. For one embodiment, the semiconductor 120 is a monocrystalline silicon. For a further embodiment, semiconductor 120 is a conductively-doped monocrystalline silicon. Other embodiments may include amorphous silicon, polycrystalline silicon (commonly referred to as polysilicon), or other semiconductor materials. Semiconductor 120 may be conductively doped to a first conductivity type, e.g., a p-type conductivity. Semiconductor 120 may represent a common conductively doped region (e.g., a common p-well) formed in a semiconductor of a different conductivity type.

Formation of the structure of FIG. 2 can include formation of source regions 121 in the semiconductor 120. Source regions 121 are regions in semiconductor 120 having a second conductivity type different than the first conductivity type, e.g., an n$^+$-type conductivity. For one embodiment, the source regions 121 are n$^+$-type regions formed by adding impurities to portions of the semiconductor 120, e.g., through implantation and/or diffusion of n-type dopants, such as arsenic or phosphorus, into the semiconductor 120.

Subsequent formation of the structure depicted in FIG. 2 includes formation of an alternating structure of semiconductor materials of the second conductivity type and the first conductivity type. In this alternating structure, the semiconductor materials of the second conductivity type will form source/drain regions of individual memory cells while the semiconductor materials of the first conductivity type will form channel regions of the individual memory cells. Thus, for a string of N memory cells, where N is some integer value greater than one, the alternating structure will include N+1 instances of semiconductor material of the second conductivity type ($122_0$-$122_n$) and N instances of semiconductor material of the first conductivity type ($124_0$-$124_{n-1}$). For example, FIG. 2 depicts an alternating structure of semiconductor material 122 of the second conductivity type and semiconductor material 124 of the first conductivity type to form a string of four memory cells, thus having five instances of semiconductor material 122 of the second conductivity type and four instances of semiconductor material 124 of the first conductivity type. Semiconductor materials 122 of the second conductivity type and semiconductor materials 124 of the first conductivity type are each semiconductor materials. Semiconductor material 122 of the second conductivity type is a different semiconductor material than the semiconductor material 124 of the first conductivity type. Although the figures depict strings of four memory cells, this number was selected to permit a clearer depiction of the processing involved and the resulting architecture. The processes and architecture described and shown herein may be extended to larger numbers of memory cells in each string of memory cells, e.g., by increasing the number of instances of the semiconductor material 122 of the second conductivity type and the semiconductor material 124 of the first conductivity type contained within the alternating structure. For example, a string of thirty two memory cells would contain thirty three instances of semiconductor material 122 of the second conductivity type and thirty two instances of semiconductor material 124 of the first conductivity type in a repeating pattern.

While each instance of the semiconductor materials 124 of the first conductivity type may have the same chemical composition, such is not required. For purposes of this application, semiconductor materials used for the various instances of semiconductor materials 124 of the first conductivity type will be deemed to be the same if they present sufficiently similar removal rates during the portion of fabrication described with reference to FIGS. 7A-7D herein that they maintain continuity such as depicted in view 125 of FIG. 7D. Similarly, for purposes of this application, semiconductor materials used for the various instances of semiconductor materials 122 of the second conductivity type will be deemed to be the same if they present sufficiently similar removal rates during the portion of fabrication described with reference to FIGS. 7A-7D herein that they form discrete source/drain regions such as depicted in view 127 of FIG. 7D.

For one embodiment, the instances of semiconductor materials 122 of the second conductivity type include formation of an epitaxial silicon doped with germanium (Ge). For example, the germanium doping may be carried out using germanium tetrahydride (GeH$_4$) while growing epitaxial silicon. For a further embodiment, the epitaxial silicon doped with germanium is a growth of a silicon-germanium (Si$_x$Ge$_{1-x}$) alloy. Silicon-germanium alloy can be grown epitaxially on silicon. For one embodiment, the silicon-germanium alloy contains approximately 20 at % germanium or more, e.g., $0<=x<=0.8$. For a still further embodiment, the epitaxial silicon doped with germanium is further conductively doped with an n-type impurity, such as arsenic (Ar) or phosphorous (P). Such conductive doping may occur during or after formation of the semiconductor material 122 of the second conductivity type.

For one embodiment, the instances of semiconductor materials 124 of the first conductivity type include formation of a p-type polysilicon. For example, formation may include a chemical vapor deposition (CVD) of polysilicon doped with a p-type impurity, such as boron (B). Such conductive doping may occur during or after formation of the semiconductor material 124 of the first conductivity type.

For one embodiment, the instances of semiconductor material 122 of the second conductivity type may each have a thickness of approximately 200 Å while the instances of semiconductor material 124 of the first conductivity type may each have a thickness of approximately 400 Å. In this manner, a string of 32 memory cells would be approximately 2 μm.

Following formation of the alternating structure of semiconductor materials 122 of the second conductivity type and semiconductor materials 124 of the first conductivity type, a subsequent semiconductor material 126 of the first conductivity type is formed. Semiconductor material 126 of the first conductivity type may include the same semiconductor material as used for semiconductor materials 124 of the first conductivity type, i.e., it may have a similar removal rate. However, continuity of semiconductor material 126 of the first conductivity type is not required following the processing described with reference to FIGS. 7A-7D, and thus a different semiconductor material may also be used. Following formation of the semiconductor material 126 of the first conductivity type, a protective dielectric 128 is formed. The protective dielectric 128 may generally be one or more dielectric materials. Some example dielectric materials for protective dielectric 128 include silicon oxides ($SiO_x$), silicon nitrides ($SiN_x$) and silicon oxynitrides ($SiO_xN_y$).

Figure 3A:
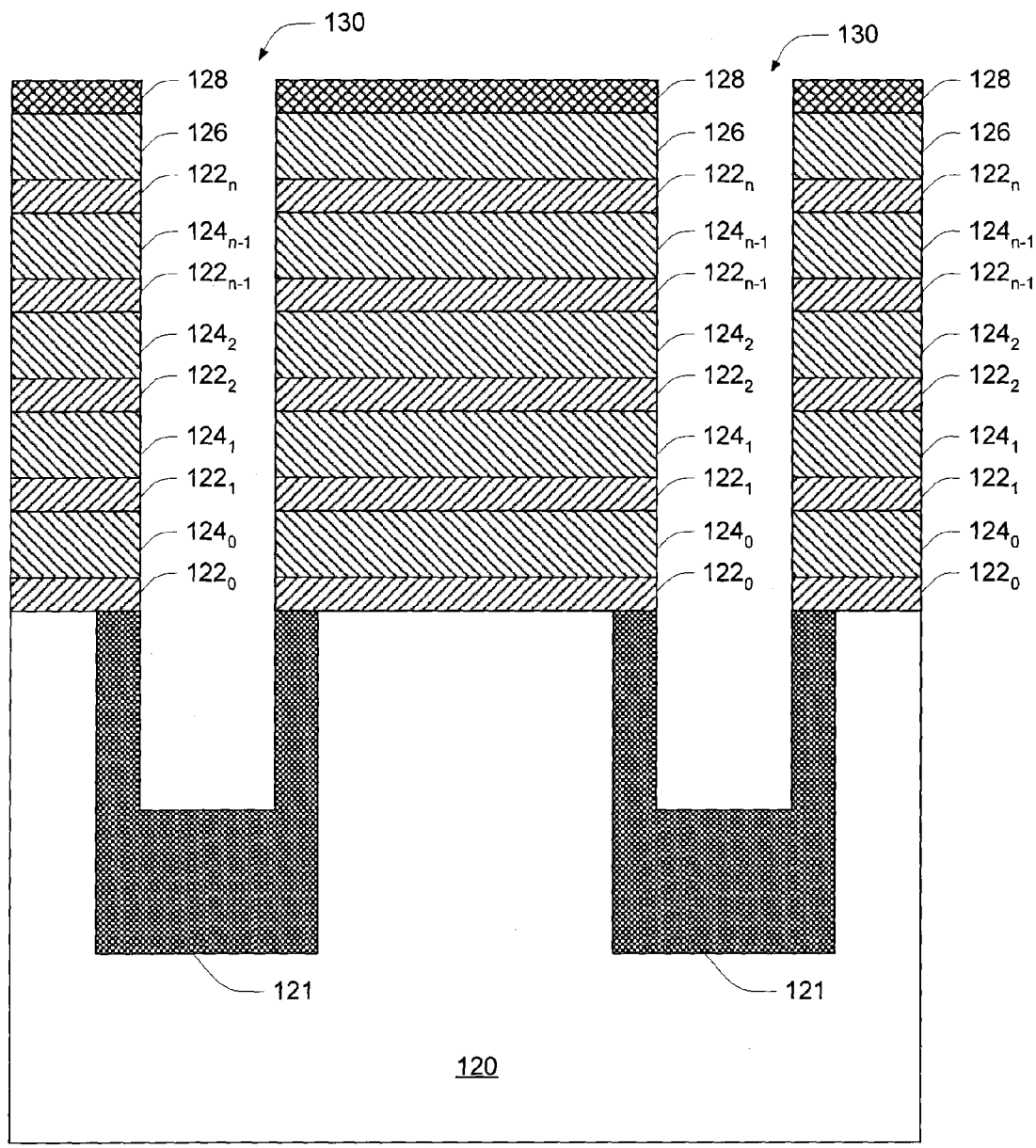
FIG. 3A is a cross-sectional view of a portion of the memory array of FIG. 1 in accordance with one embodiment.
Figure 3B:
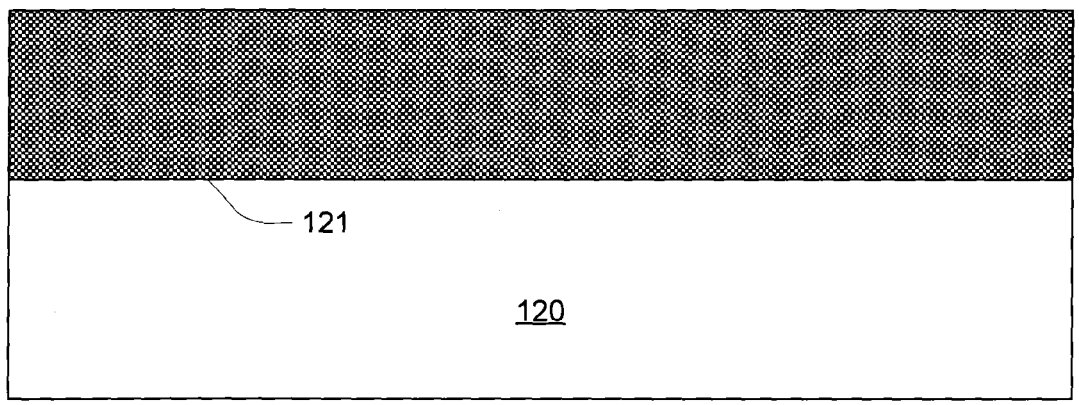
FIG. 3B is a cross-sectional view of a portion of the memory array of FIG. 1 in accordance with one embodiment.

FIG. 3A is a cross-sectional view of a portion of the memory array 100 taken along view line 106 of FIG. 1. In FIG. 3A, trenches 130 are formed through the protective dielectric 128 and into the source regions 121, i.e., through the semiconductor material 126 of the first conductivity type, and the alternating structure of semiconductor materials 122 of the second conductivity type and semiconductor materials 124 of the first conductivity type. In at least one embodiment, the trenches 130 should not extend through the source regions 121 so conductivity can be maintained between portions of the source regions 121 on opposing sides of the trenches 130. Maintaining conductivity between portions of the source regions 121 on opposing sides of the trenches allows memory cells to be formed on each side of the trenches 130 using a shared source region 121. FIG. 3B is a cross-sectional view of a portion of the memory array 100 taken along view line 112 of FIG. 1, showing removal of the protective dielectric 128, the semiconductor material 126 of the first conductivity type, the alternating structure of semiconductor materials 122 of the second conductivity type and semiconductor materials 124 of the first conductivity type, and a portion of the source region 121.

Figure 4A:
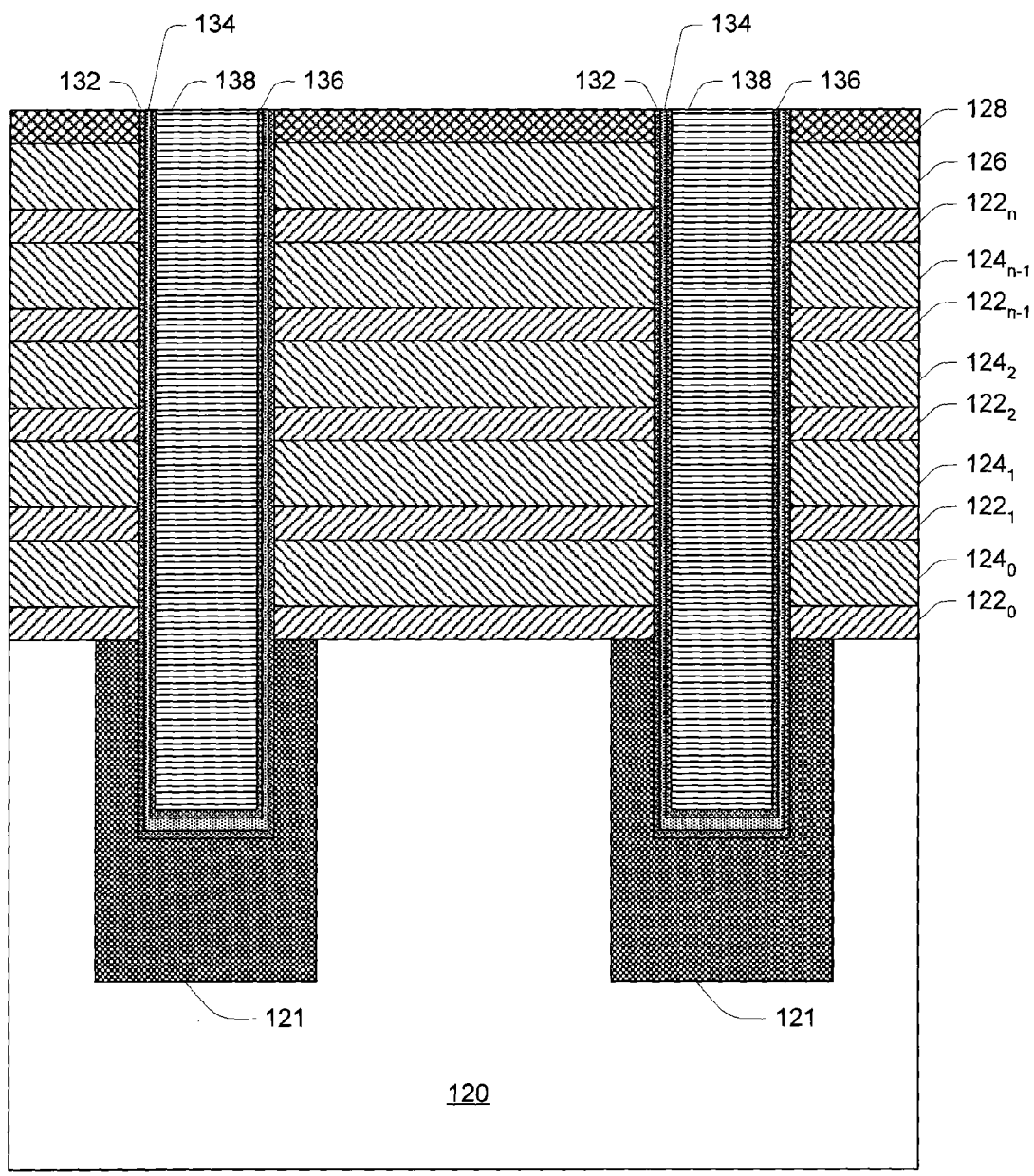
FIG. 4A is a cross-sectional view of a portion of the memory array of FIG. 1 in accordance with one embodiment.
Figure 4B:
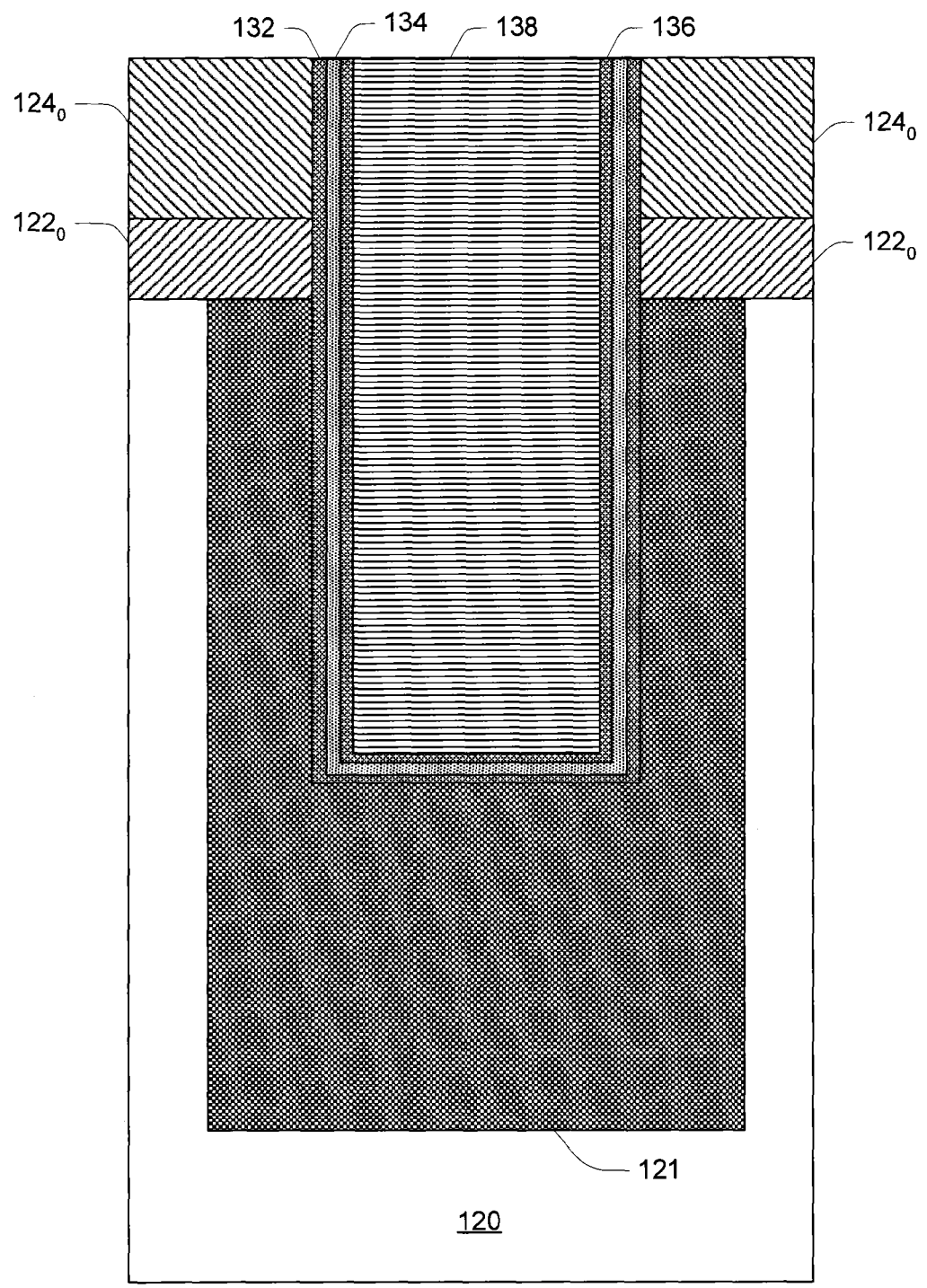
FIG. 4B is a cross-sectional view of a portion of the memory array 100 showing additional detail of a gate stack formed in FIG. 4A.
Figure 4C:
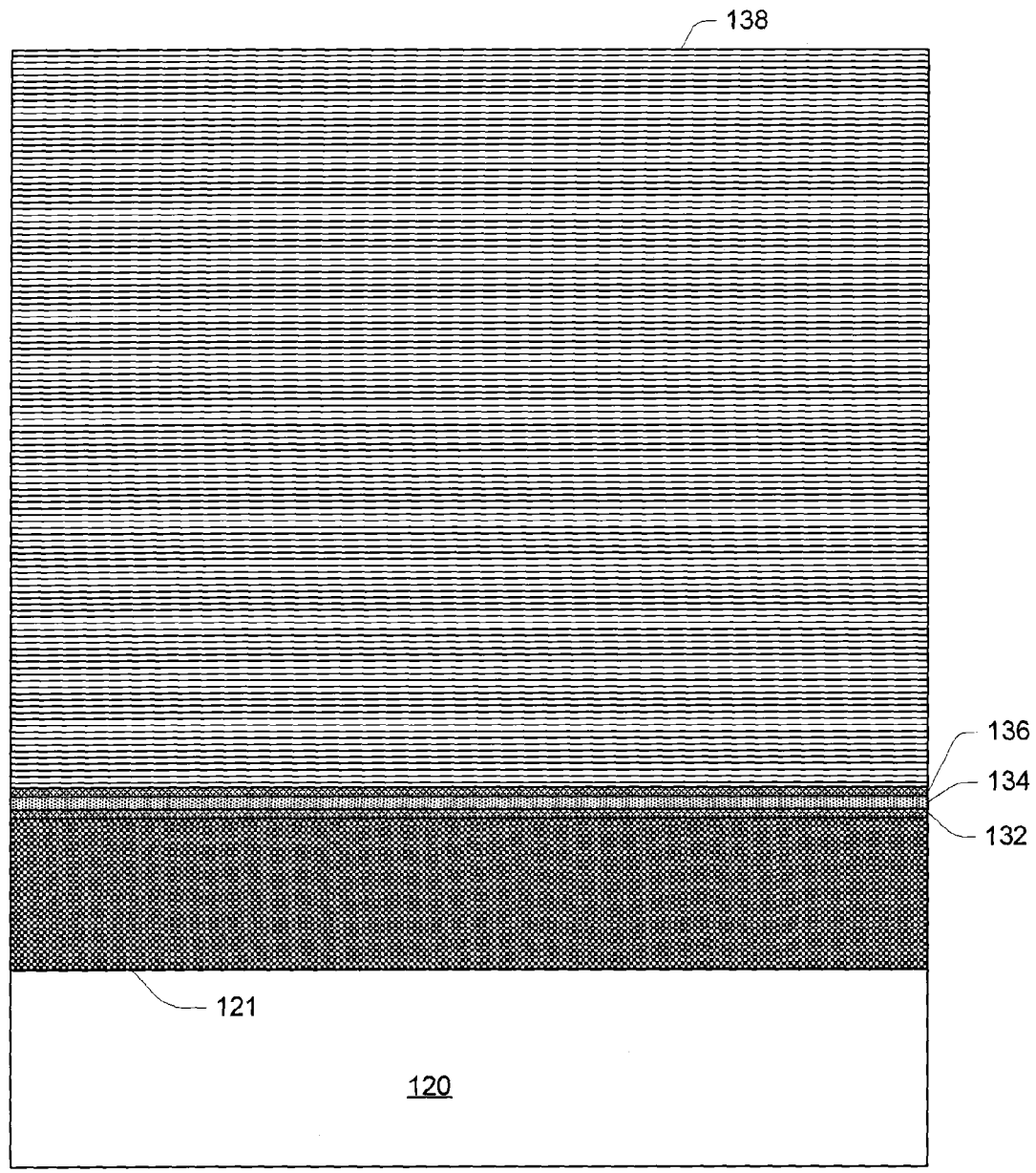
FIG. 4C is a cross-sectional view of a portion of the memory array of FIG. 1 in accordance with one embodiment.

FIG. 4A is a cross-sectional view of a portion of the memory array 100 taken along view line 106 of FIG. 1. Several processing steps have occurred between the structure depicted in FIG. 3A and the structure depicted in FIG. 4A. In particular, gate stacks for future memory cells have been formed. The gate stacks include a first dielectric 132 formed on surfaces of the trenches 130, a discrete charge storage node 134 formed on the first dielectric 132, a second dielectric 136 formed on the discrete charge storage node 134, and a conductor 138 filling a remainder of the trenches 130. The first dielectric 132 forms a tunnel dielectric for the memory cells while the second dielectric 136 forms an interlayer dielectric for the memory cells, isolating the discrete charge storage node 134 from the conductor 138, which forms the control gate for the memory cells. FIG. 4B is a cross-sectional view of a portion of the memory array 100 showing additional detail of the gate stack formed in FIG. 4A. FIG. 4C is a cross-sectional view of a portion of the memory array 100 taken along view line 112 of FIG. 1 following formation of the gate stacks.

The first dielectric 132 is generally one or more dielectric materials. The first dielectric 132 might be formed, for example, by thermal oxidation of the exposed surfaces of the source regions 121, instances of the semiconductor materials 122 of the second conductivity type and the semiconductor materials 124 of the first conductivity type, and the semiconductor material 126 of the first conductivity type. Alternatively, the first dielectric 132 could be formed by a blanket deposition of a dielectric material, such as by chemical vapor deposition (CVD) or atomic layer deposition (ALD). Example dielectric materials for first dielectric 132 include silicon oxides ($SiO_x$), silicon nitrides ($SiN_x$), silicon oxynitrides ($SiO_xN_y$), aluminum oxides ($AlO_x$), hafnium oxides ($HfO_x$), hafnium aluminum oxides ($HfAlO_x$), lanthanum oxides ($LaO_x$), tantalum oxides ($TaO_x$), zirconium oxides ($ZrO_x$), zirconium aluminum oxides ($ZrAlO_x$), etc., and combinations thereof. Where a deposition is performed, dielectric formed on the upper surface of protective dielectric 128 may be removed, such as by chemical mechanical polishing (CMP), if desired. Note also, where thermal oxidation is used, the first dielectric 132 may not extend to cover exposed surfaces of the protective dielectric 128, as depicted in FIG. 4A, where no further oxidation of protective dielectric 128 is possible.

The discrete charge storage node 134 is then formed over the first dielectric 132. The discrete charge storage node 134 is adapted to store charge locally. In this manner, discrete charge storage node 134 need not be patterned to separate charge storage nodes of individual memory cells. For example, the discrete charge storage node 134 may be formed of conductive nanodots, i.e., discrete formations of conductive material capable of storing a charge. As a further example, the discrete charge storage node 134 may be formed of discrete formations of metal, such as titanium, tantalum, tungsten, ruthenium, rhodium, platinum, etc., or metal alloys thereof. Alternatively, the discrete charge storage node 134 may be formed of discrete formations, for example, of conductive metal nitrides, conductive metal oxides or conductive metal silicides, or combinations of any of the foregoing.

Figure 4D:
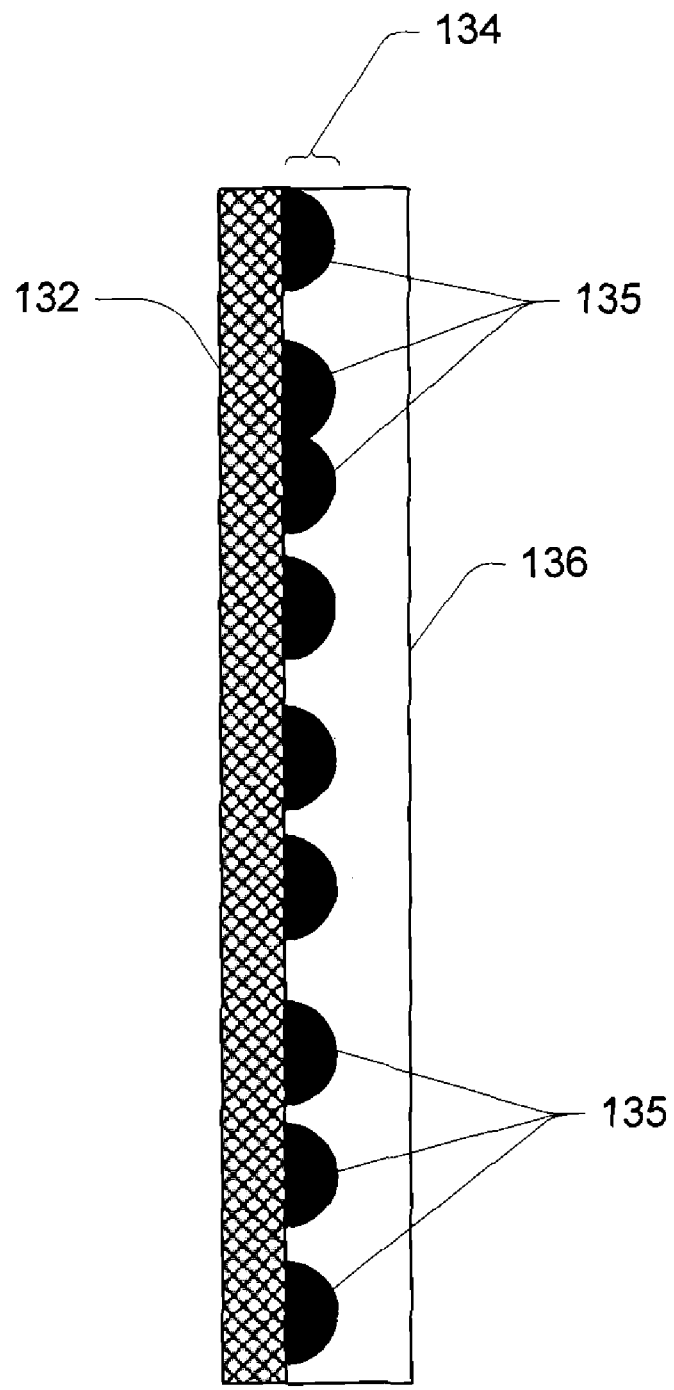
FIG. 4D depicts conceptually a discrete charge storage node in accordance with an embodiment.

FIG. 4D depicts conceptually the discrete charge storage node 134 formed of conductive nanodots 135. Conductive nanodots 135 may be formed, for example, by CVD, ALD, PVD, etc. The conductive nanodots 135 generally represent discrete formations of conductive material, e.g., metal-containing material or the like, such that while some individual nanodots 135 may be adjoining one another, there will be portions of the first dielectric 132 that will remain exposed between the conductive nanodots 135, and the conductive nanodots 135 will not form a contiguous conductive entity. Accordingly, after the second dielectric 136 is formed over the conductive nanodots 135, it may form on such exposed portions of the first dielectric 132. For one embodiment, a density of the conductive nanodots 135 is approximately $1E12/cm^2$ to $1E15/cm^2$. For a further embodiment, the density of the conductive nanodots 135 is approximately $1E13/cm^2$. For one embodiment, the conductive nanodots 135 have a thickness of approximately 20 Å+/−10 Å (2 nm+/−1 nm). The conductive nanodots 135 collectively define the discrete charge storage node 134.

The second dielectric 136 is then formed over the discrete charge storage node 134. The second dielectric 136 is generally one or more dielectric materials. For example, the second dielectric 136 may include one or more layers of dielectric materials including high-K dielectric materials. Example high-K dielectric materials for intergate dielectric 320 include aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), yttrium oxide ($Y_2O_3$), etc. Other examples for second dielectric 136 include silicon oxides ($SiO_x$), silicon nitrides ($SiN_g$), silicon oxynitrides ($SiO_xN_y$) or combinations thereof. For example, the second dielectric 136 may be an ONO (oxide-nitride-oxide) structure, i.e., a formation of silicon oxide, followed by a formation of silicon nitride, and followed by another formation of silicon oxide.

The conductor 138 is formed over the second dielectric 136 to fill the trenches 130. In general, the conductor 138 includes one or more conductive materials. For one embodiment, the conductor 138 contains a conductively-doped polysilicon. For another embodiment, the conductor 138 contains a metal-containing material. For a further embodiment, the conductor 138 includes a metal-containing material on polysilicon, e.g., a refractory metal silicide formed on a conductively-doped polysilicon. The metals of chromium (Cr), cobalt (Co), hafnium (Hf), molybdenum (Mo), niobium (Nb), tantalum (Ta), titanium (Ti), tungsten (W), vanadium (V), zirconium (Zr), and metal nitrides (including, for example, titanium nitride, tantalum nitride, tantalum carbon nitride, tungsten nitride) for metal gates are generally recognized as refractory metal materials. For another embodiment, the conductor 138 contains multiple metal-containing materials, e.g., a titanium nitride (TiN) barrier over the second dielectric 136, titanium (Ti) as an adhesion material over the barrier, and tungsten (W) over the adhesion material. As depicted in FIG. 4A, excess conductor 138 may be partially or fully removed from an upper surface of the structure, such as by CMP. Furthermore, although not depicted in FIG. 4A, formations of the first dielectric 132, discrete charge storage node 134 and second dielectric 136 may extend over the upper surface of the protective dielectric 128 as this configuration would not interfere with the isolation of individual memory cells or strings of memory cells.

Figure 5A:
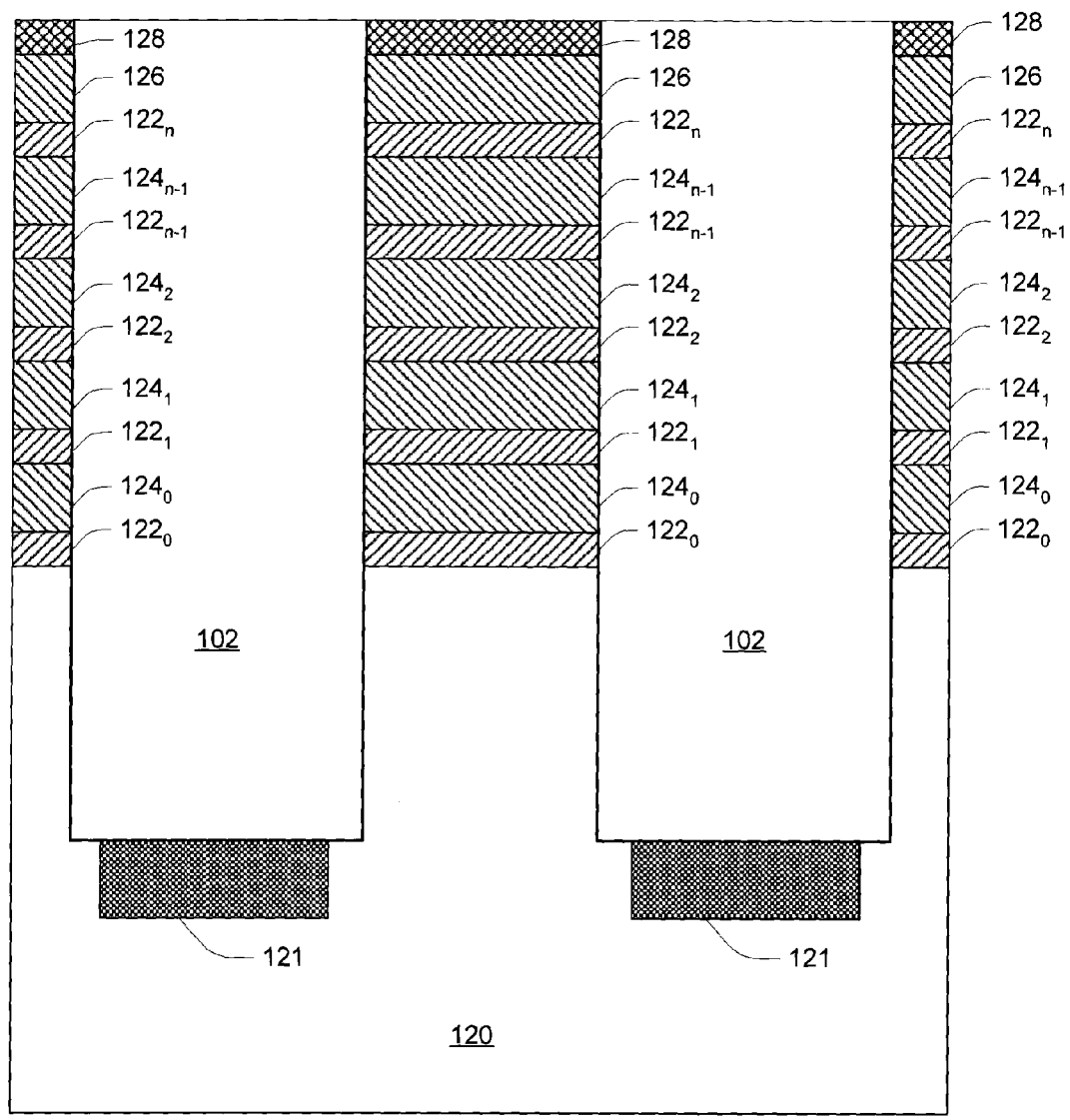
FIG. 5A is a cross-sectional view of a portion of the memory array of FIG. 1 in accordance with one embodiment.
Figure 5B:
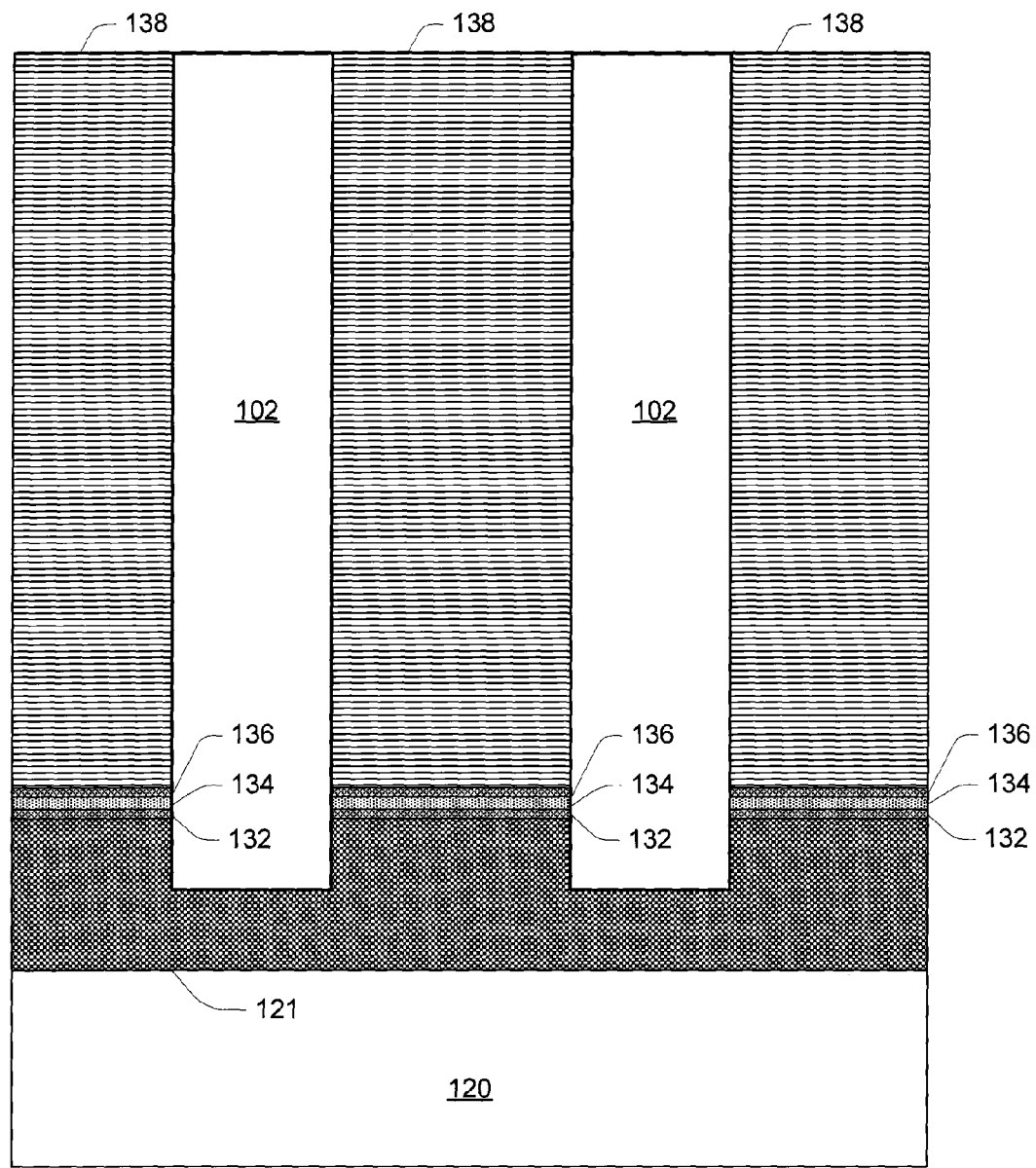
FIG. 5B is a cross-sectional view of a portion of the memory array of FIG. 1 in accordance with one embodiment.

FIG. 5A is a cross-sectional view of a portion of the memory array 100 taken along view line 108 of FIG. 1. In FIG. 5A, isolation regions 102 are formed orthogonal to the trenches 130, and thus the conductors 138. Formation of isolation regions 102 may include formation of trenches through the protective dielectric 128, the semiconductor material 126 of the first conductivity type, the alternating structure of semiconductor materials 122 of the second conductivity type and semiconductor materials 124 of the first conductivity type, and into the source regions 121. Formation of the trenches for isolation regions 102 further segments the gate stacks of FIG. 4A to define future individual NAND strings. The trenches for isolation regions 102 extend below the conductors 138 depicted in FIG. 4A, such as to isolate individual strings of memory cells, but do not extend below the source regions 121, such as to maintain conductivity of the shared source regions 121. These trenches are then filled with a dielectric material to form the isolation regions 102. FIG. 5B is a cross-sectional view of a portion of the memory array 100 taken along view line 112 of FIG. 1, showing the extension of the isolation regions 102 below the conductor 138 and into the source region 121. It can be seen from the figures that the conductor 138 would be segmented by these isolation regions 102, having two instances of first dielectric 132, discrete charge storage node 134 and second dielectric 136 on two opposing sides (see FIG. 4A), and two instances of isolation regions 102 on another two opposing sides (see FIG. 5B), leaving only an upper surface exposed. Such a structure would define two future NAND strings on opposing sides of a conductor 138.

Figure 6A:
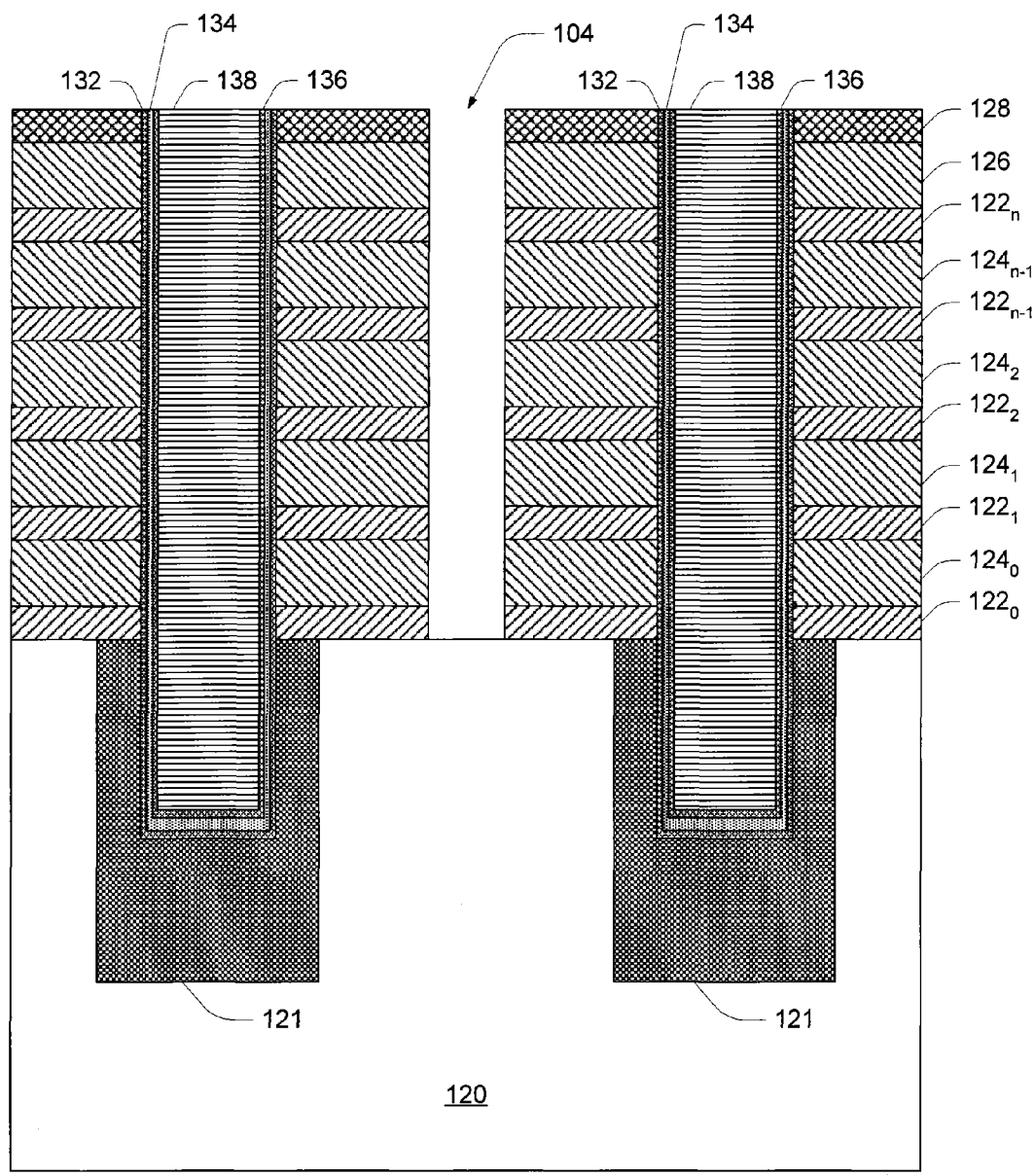
FIG. 6A is a cross-sectional view of a portion of the memory array of FIG. 1 in accordance with one embodiment.
Figure 6B:
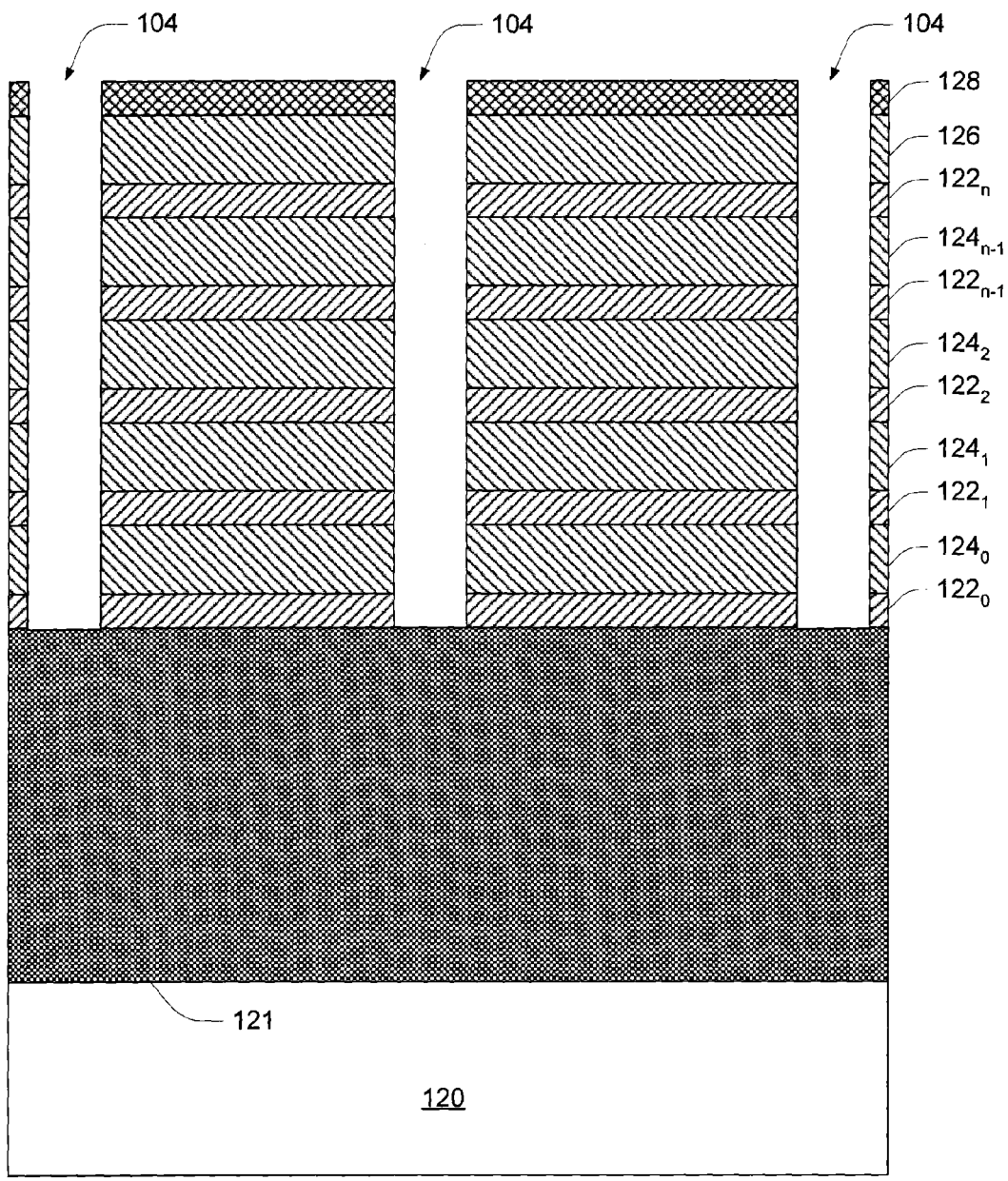
FIG. 6B is a cross-sectional view of a portion of the memory array of FIG. 1 in accordance with one embodiment.

FIG. 6A is a cross-sectional view of a portion of the memory array 100 taken along view line 106 of FIG. 1. In FIG. 6A, an access hole 104 is formed between conductors 138. The access hole 104 is formed through the protective dielectric 128, the semiconductor material 126 of the first conductivity type, and the alternating structure of semiconductor materials 122 of the second conductivity type and semiconductor materials 124 of the first conductivity type. The access hole 104 may extend to a surface of the semiconductor 120 (as shown in FIG. 6A), but only needs to extend far enough to expose surfaces of the first instance of the semiconductor material $122_0$ of the second conductivity type. FIG. 6B is a cross-sectional view of a portion of the memory array 100 taken along view line 110 of FIG. 1 showing additional access holes 104. To aid symmetry of the subsequent removal of portions of the semiconductor materials 122 of the second conductivity type, it may be desirable to position the access holes 104 at intersections of lines running parallel to edges of the isolation regions 102, such as shown by the intersection of view lines 106 and 110 of FIG. 1.

The access holes 104 provide access to the instances of semiconductor materials 122 of the second conductivity type and semiconductor materials 124 of the first conductivity type for a subsequent selective removal process. The purpose of this selective removal process is to define individual memory cells by defining discrete source/drain regions (from semiconductor materials 122 of the second conductivity type) for individual memory cells while maintaining conductivity of channel regions (semiconductor materials 124 of the second conductivity type) shared by more than one memory cell. Because the semiconductor materials 122 of the second conductivity type are a different semiconductor material than the semiconductor materials 124 of the first conductivity type, a single removal process, e.g., an isotropic removal process, can be utilized to selectively remove semiconductor materials 122 of the second conductivity type at a faster rate than semiconductor materials 124 of the first conductivity type. This permits the formation of discrete portions of semiconductor material 122 of the second conductivity type while maintaining continuity of semiconductor material 124 of the first conductivity type. For example, a wet etch process having a higher selectivity to the semiconductor material 122 of the second conductivity type over the semiconductor material 124 of the first conductivity type may be used.

Figure 7A:
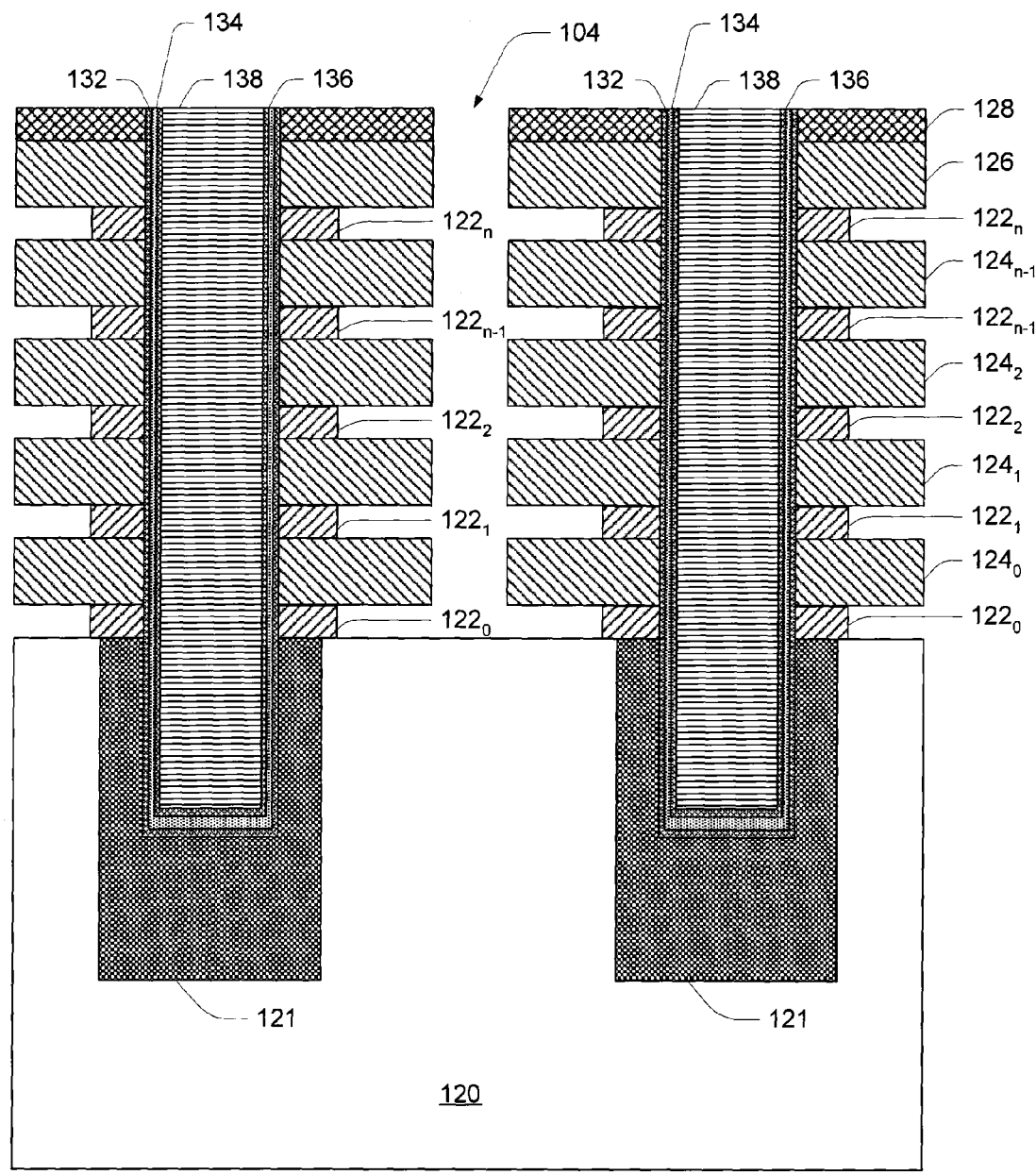
FIG. 7A is a cross-sectional view of a portion of the memory array of FIG. 1 in accordance with one embodiment.
Figure 7B:
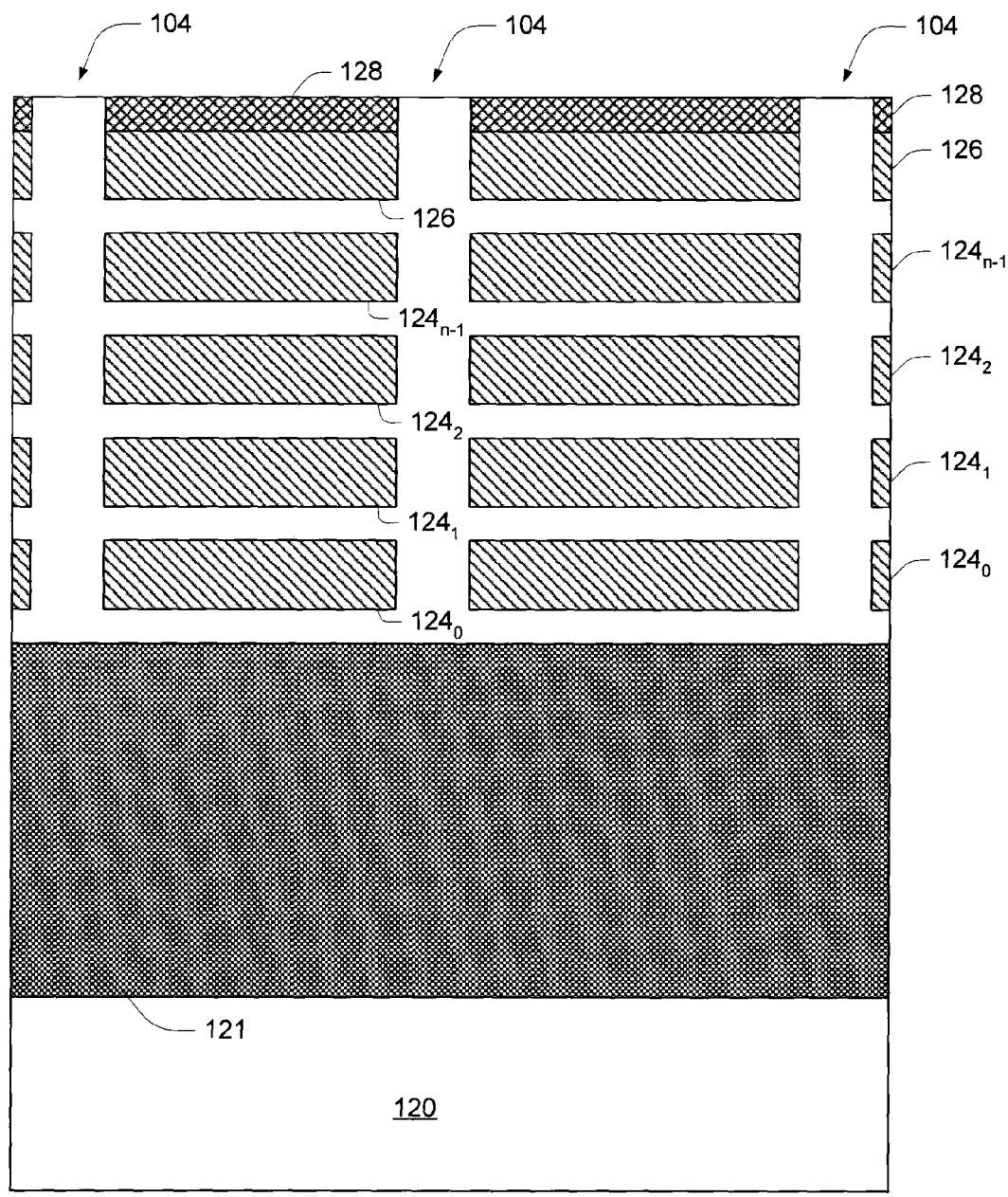
FIG. 7B is a cross-sectional view of a portion of the memory array of FIG. 1 in accordance with one embodiment.
Figure 7C:
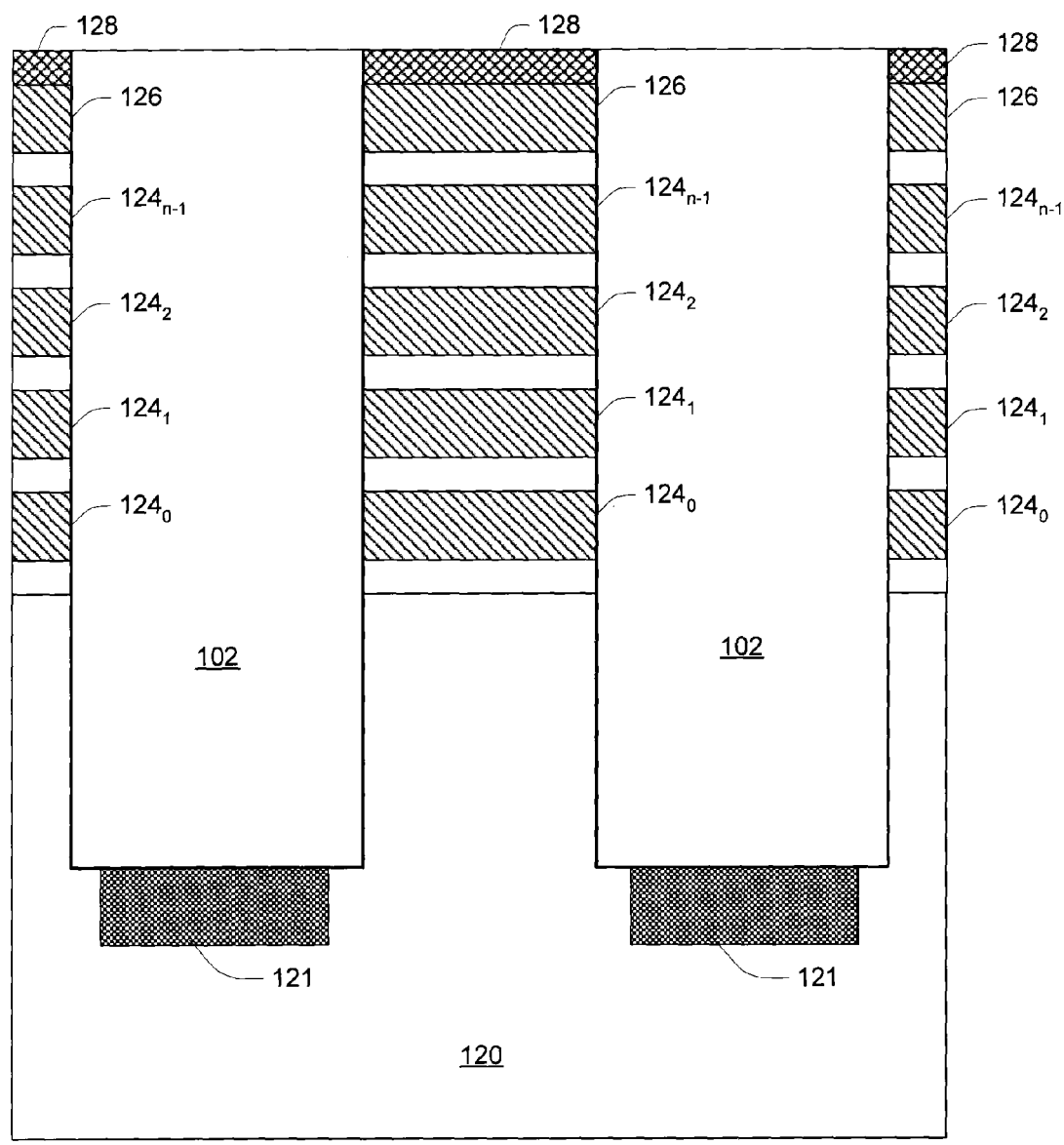
FIG. 7C is a cross-sectional view of a portion of the memory array of FIG. 1 in accordance with one embodiment.

FIG. 7A is a cross-sectional view of a portion of the memory array 100 taken along view line 106 of FIG. 1. FIG. 7B is a cross-sectional view of a portion of the memory array 100 taken along view line 110 of FIG. 1. FIG. 7C is a cross-sectional view of a portion of the memory array 100 taken along view line 108 of FIG. 1. FIGS. 7A-7C depict the more extensive removal of the semiconductor materials 122 of the second conductivity type. It is noted that semiconductor materials 124 of the first conductivity type may show no significant removal where the difference in removal rates is large. The choice of removal process or chemicals for a wet etch will depend upon the choice of materials in the alternating structure. However, selective removal processes are well understood in the art. Following removal, the voids formed by removal of semiconductor material 122 of the second conductivity type may be filled with a dielectric material. Because of the complex and narrow void structure formed, a more penetrating dielectric material, such as formed by a spin-on dielectric process where a fluid precursor is applied to a surface and allowed to penetrate the openings before curing, may be used. However, because voids are inherently dielectric in nature, completely filling the voids may not be required.

Figure 7D:
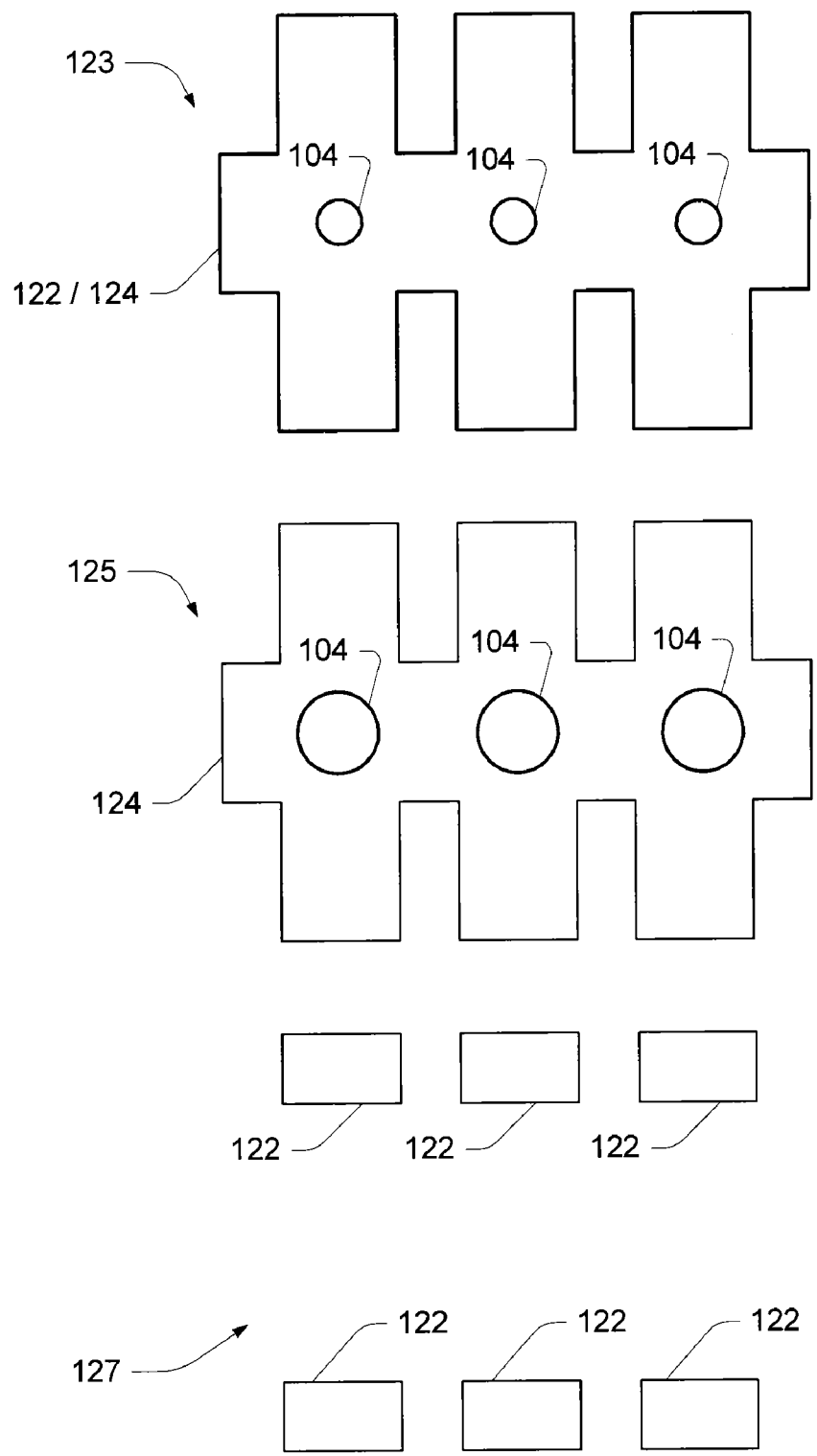
FIG. 7D is a top view of a portion of the memory array of FIG. 1 showing additional detail of elements of the structure depicted in FIGS. 7A-7C.

FIG. 7D is a top view of a portion of the memory array 100 showing additional detail of elements of the structure depicted in FIGS. 7A-7C. View 123 of FIG. 7D depicts a portion of the geometry of an instance of a semiconductor material 122 of the second conductivity type or an instance of a semiconductor material 124 of the first conductivity type prior to the removal process described with reference to FIGS. 7A-7C. View 125 of FIG. 7D depicts a portion of the geometry of an instance of a semiconductor material 124 of the first conductivity type after the removal process described with reference to FIGS. 7A-7C. View 125 shows that while the access holes 104 may become enlarged by the removal of a portion of the semiconductor material 124 of the first conductivity type, continuity is maintained. View 127 of FIG. 7D depicts a portion of the geometry of an instance of a semiconductor material 122 of the second conductivity type after the removal process described with reference to FIGS. 7A-7C. View 127 shows that sufficient portions of the semiconductor material 122 of the second conductivity type are removed to form discrete portions separated from one another. In this manner, an instance of semiconductor material 124 of the first conductivity type forming a channel region for one memory cell can also form a channel region for other memory cells such that a single contact to an instance of semiconductor material 124 of the first conductivity type can facilitate biasing of channel regions for more than one memory cell. Similarly, by separating an instance of semiconductor material 122 of the second conductivity type into discrete portions, individual memory cells associated with an instance of semiconductor material 124 of the first conductivity type can be separated from one another. The discrete portions of semiconductor material 122 of the second conductivity type represent individual source/drain regions for the memory cells.

At this stage, individual memory cells are now defined. In particular, a memory cell includes the conductor 138 as its control gate, the second dielectric 136 as an intergate dielectric, a portion of the discrete charge storage node 134 as its storage node (i.e., that portion between an associated instance of semiconductor material 124 of the first conductivity type and the conductor 138), the first dielectric 132 as its tunnel dielectric, an instance of semiconductor material 124 of the first conductivity type (e.g., $124_0$) as its channel, an instance of semiconductor material 122 of the second conductivity type (e.g., $122_0$) as a first source/drain region, and another instance of semiconductor material 122 of the second conductivity type (e.g., $122_1$) as a second source/drain region. A NAND string of serially-connected non-volatile memory cells includes those memory cells connected source to drain, and located between a source region 121 and the semiconductor material 126 of the first conductivity type. Memory cells may be formed on opposing sides of a conductor 138 as depicted in FIG. 7A, thus defining two NAND strings of serially-connected non-volatile memory cells.

The memory cells of a NAND string of FIG. 7A share a common control gate. Accordingly, to access individual memory cells of the string, their channel regions are selectively biased. To read a target memory cell of such a NAND string, all unselected memory cells of the string are activated regardless of their stored data value, while the target memory cell is selectively activated depending upon its stored data value. For example, if a memory cell having a channel region formed by semiconductor material $124_1$ of the first conductivity type is the target memory cell, reading a data value might include applying a first potential to the conductor 138, e.g., a read voltage of some potential between a threshold voltage range representative of a first data value, such as a logical 1, and a threshold voltage range representative of a second data value, such as a logical 0. Reading the data value might further include applying a second potential, e.g. a ground potential Vss, to the semiconductor material $124_1$ of the first conductivity type such that the target memory cell would be activated if the charge stored in its portion of the discrete charge storage node 134 represents the first data value and deactivated if the charge stored in its portion of the discrete charge storage node 134 represents the second data value. Remaining semiconductor materials 124 of the first conductivity type associated with the same conductor 138, e.g., semiconductor materials $124_0$, $124_2$ and $124_{n-1}$ of FIG. 7A, would receive a third potential sufficient to activate the remaining memory cells of the NAND string regardless of the charge stored in their portions of the discrete charge storage node 134. In this manner, the conductance between a source region 121 and an associated last instance $122_n$ of material of the second conductivity type will depend only on a data value of the target memory cell. By precharging a data line (not shown in FIG. 7A) or applying a current to the data line coupled to the last instance $122_n$ of material of the second conductivity type, for example, a voltage change in the data line will be representative of the data value of the target memory cell. While the foregoing example related to a two-state memory cell, multi-level memory is well known where more than two data values may be represented on a single memory cell, such as by defining more than two mutually exclusive ranges of threshold voltages, each corresponding to one of the data values. Typically, the number of data values that may be represented by a memory cell is some power of two. Data schemes using some number of mutually exclusive threshold voltage ranges that is not a power of two are also known. However, this disclosure is not limited or dependent upon a particular number of data values that may be represented by a memory cell.

Writing data values to individual memory cells, or erasing memory cells would utilize the same concepts, e.g., selectively applying potentials to conductors 138, data lines (not shown in FIG. 7A) and semiconductor materials 124 of the first conductivity type. For write operations to NAND strings of serially-connected non-volatile memory cells, it is typical to use differing biases to different portions of the NAND strings to reduce coupling between adjacent charge storage nodes to mitigate disturb. In traditional NAND memory, this generally involves developing different channel potentials through the application of differing access line potentials. However, control is limited as the channel regions are formed of a contiguous semiconductor material. Utilizing embodiments described herein, each channel region can be individually biased as they are separated from one another by the semiconductor materials 122 of the second conductivity type, i.e., they are discrete formations of semiconductor materials 124 of the first conductivity type on opposing sides an instance of semiconductor material 122 of the second conductivity type. Such individual biasing may facilitate increased flexibility in reducing adverse coupling of charge storage nodes during write operations.

While semiconductor materials 124 of the first conductivity type located between two conductors 138 represent a single contiguous instance of semiconductor material 124, semiconductor materials 124 on opposing sides of a conductor 138 represent isolated instances of semiconductor material 124, i.e., there is no connectivity between semiconductor material 124 on one side of a conductor and semiconductor material 124 on the opposing side of the conductor as these materials have been isolated by the formation of the trenches 130 of FIG. 3A. Thus, a single conductor 138 extending between two isolation regions 102 may have two NAND strings formed on opposing sides of the conductor 138 in certain embodiments. In such a configuration, the two NAND strings would share a common conductor 138 as well as a common source region 121, but would utilize different data lines (see FIG. 9C).

Figure 8A:
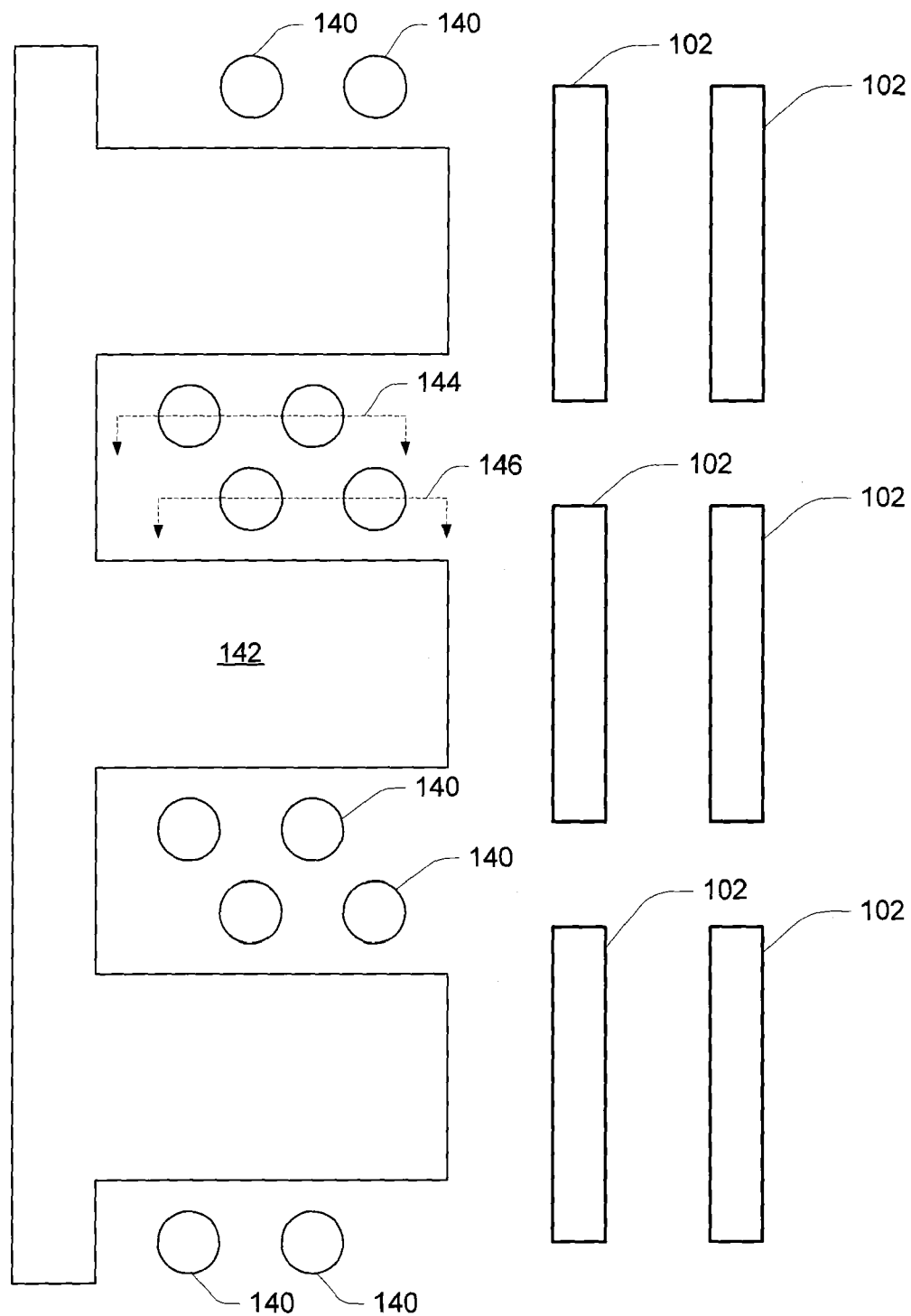
FIG. 8A is a top view of another portion of a memory array in accordance with an embodiment.

To bias the individual channel regions (semiconductor materials 124), connections are made to each channel region. FIG. 8A is a top view of another portion of the memory array 100 showing one example of these channel contacts. Channel contacts 140 are formed to each connect to a different channel region such that each channel region is connected to one of the channel contacts 140. Because a gate stack (not shown in FIG. 8A) is formed to extend between the isolation region 142 and each adjacent isolation region 102, each grouping of channel contacts 140 is isolated from other groupings of channel contacts 140.

Figure 8B:
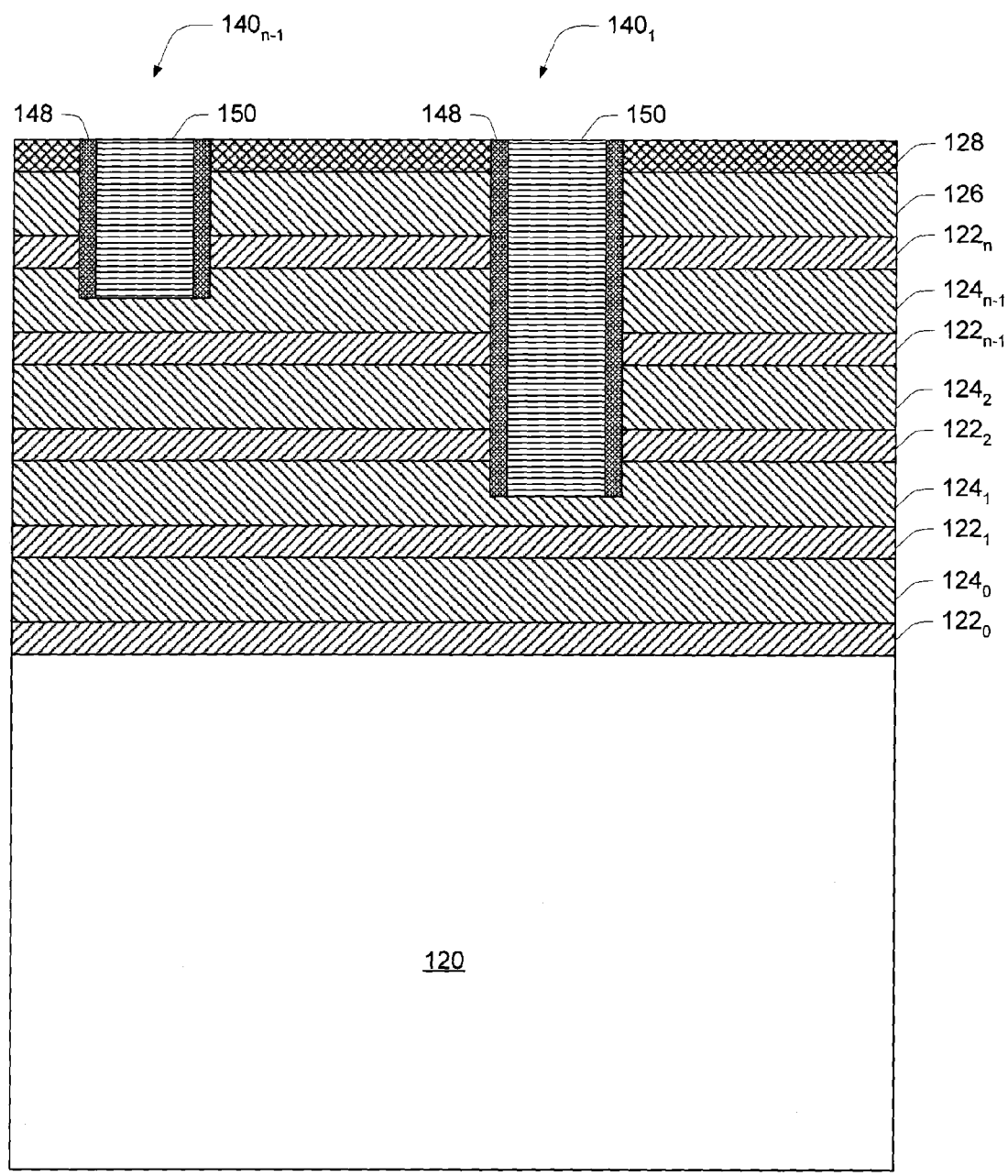
FIG. 8B is a cross-sectional view of an interconnect portion of the memory array shown top down in FIG. 8A in accordance with one embodiment.

FIG. 8B is a cross-sectional view of a portion of the memory array 100 taken along view line 144 of FIG. 8A. As depicted in FIG. 8B, a channel contact $140_{n-1}$ is formed to be in contact with the semiconductor material $124_{n-1}$ of the first conductivity to provide connectivity to all channel regions associated with the semiconductor material $124_{n-1}$ located between two adjacent conductors 138. As further depicted in FIG. 8B, a channel contact $140_1$ is formed to be in contact with the semiconductor material $124_1$ of the first conductivity to provide connectivity to all channel regions associated with the semiconductor material $124_1$ located between the two adjacent conductors 138.

Figure 8C:
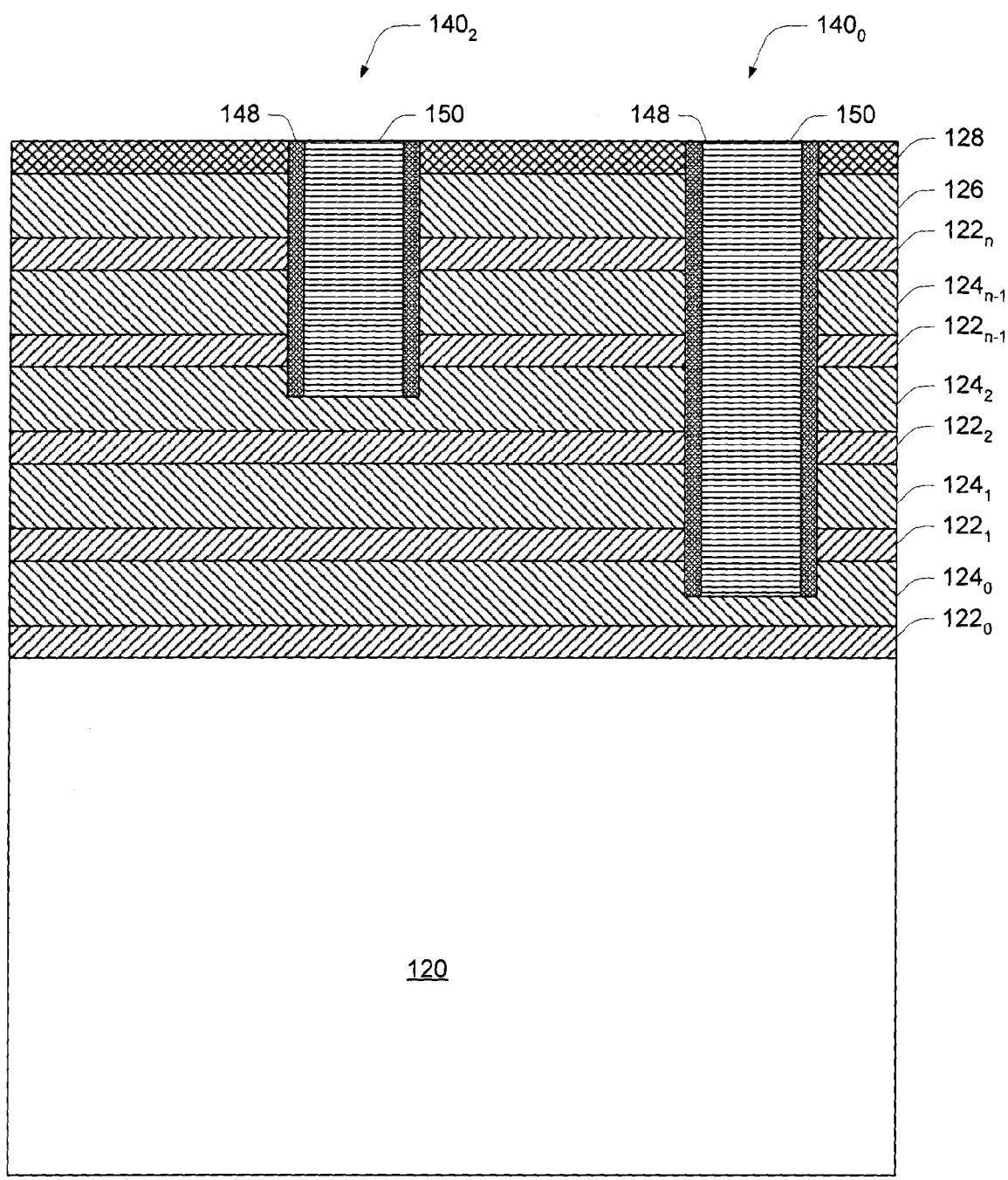
FIG. 8C is a cross-sectional view of an interconnect portion of the memory array shown top down in FIG. 8A in accordance with one embodiment.

FIG. 8C is a cross-sectional view of a portion of the memory array 100 taken along view line 146 of FIG. 8A. As depicted in FIG. 8C, a channel contact $140_2$ is formed to be in contact with the semiconductor material $124_2$ of the first conductivity to provide connectivity to all channel regions associated with the semiconductor material $124_2$ located between the two adjacent conductors 138. As further depicted in FIG. 8C, a channel contact $140_0$ is formed to be in contact with the semiconductor material $124_0$ of the first conductivity to provide connectivity to all channel regions associated with the semiconductor material $124_0$ located between the two adjacent conductors 138. Although not depicted in the figures, similar connections may be used for connecting to the source regions 121.

Each channel contact $140_0$-$140_{n-1}$ of a grouping provides connectivity to one of the semiconductor materials 124 of the first conductivity type located between two adjacent conductors 138, which provides the ability to individually bias the channel regions of memory cells of each NAND strings, noting that two memory cells sharing the same semiconductor material 124 of the first conductivity type, i.e., two memory cells formed on the facing sides of the two conductors 138, would receive the same channel bias. The channel contacts 140 may be formed, for example, by forming a contact hole extending to at least expose a surface of the desired instance of semiconductor material 124 of the first conductivity type, forming a dielectric material on the surfaces of the contact hole, performing an anisotropic removal of the dielectric material to leave dielectric spacers 148 on sidewalls of the contact hole, and then filling the contact hole with one or more conductive materials to form a conductor 150. Selection of dielectric and conductive materials can follow similar guidance as discussed above with reference to the first dielectric 132, second dielectric 136 and conductor 138, for example.

Forming contacts holes of varying depths for channel contacts 140 may be performed by forming a hard mask defining all of the contact holes, then performing a removal process, e.g., an etch process, to extend each contact hole to at least expose the top semiconductor material 124 of the first conductivity type (e.g., semiconductor material $124_{n-1}$ of FIGS. 8B-8C). A second mask is then formed to cover all but one contact hole of each grouping, e.g., contact hole for channel contact $140_0$ of FIG. 8C. A second removal process is then performed to extend this contact hole to at least expose the next semiconductor material 124 of the first conductivity type (e.g., semiconductor material $124_2$ of FIGS. 8B-8C). A portion of the second mask is then removed to expose one additional contact hole of each grouping, e.g., contact hole for channel contact $140_1$ of FIG. 8B. A subsequent removal process is then performed to extend this contact hole to at least expose the next semiconductor material 124 of the first conductivity type (e.g., semiconductor material $124_2$ of FIGS. 8B-8C), and extend the prior contact hole (e.g., contact hole for channel contact $140_0$ of FIG. 8C) to at least expose the next semiconductor material 124 of the first conductivity type (e.g., semiconductor material $124_1$ of FIGS. 8B-8C). This process is then repeated until each contact hole of a grouping is formed to at least expose its corresponding semiconductor material 124. The dielectric spacers 148 and conductors 150 may then be formed in each contact hole concurrently. It is clear that this process could be extended to more than four channel contacts 140. Similarly, other means of connecting to the individual instances of semiconductor materials 124 of the first conductivity type may be envisioned.

Figure 9A:
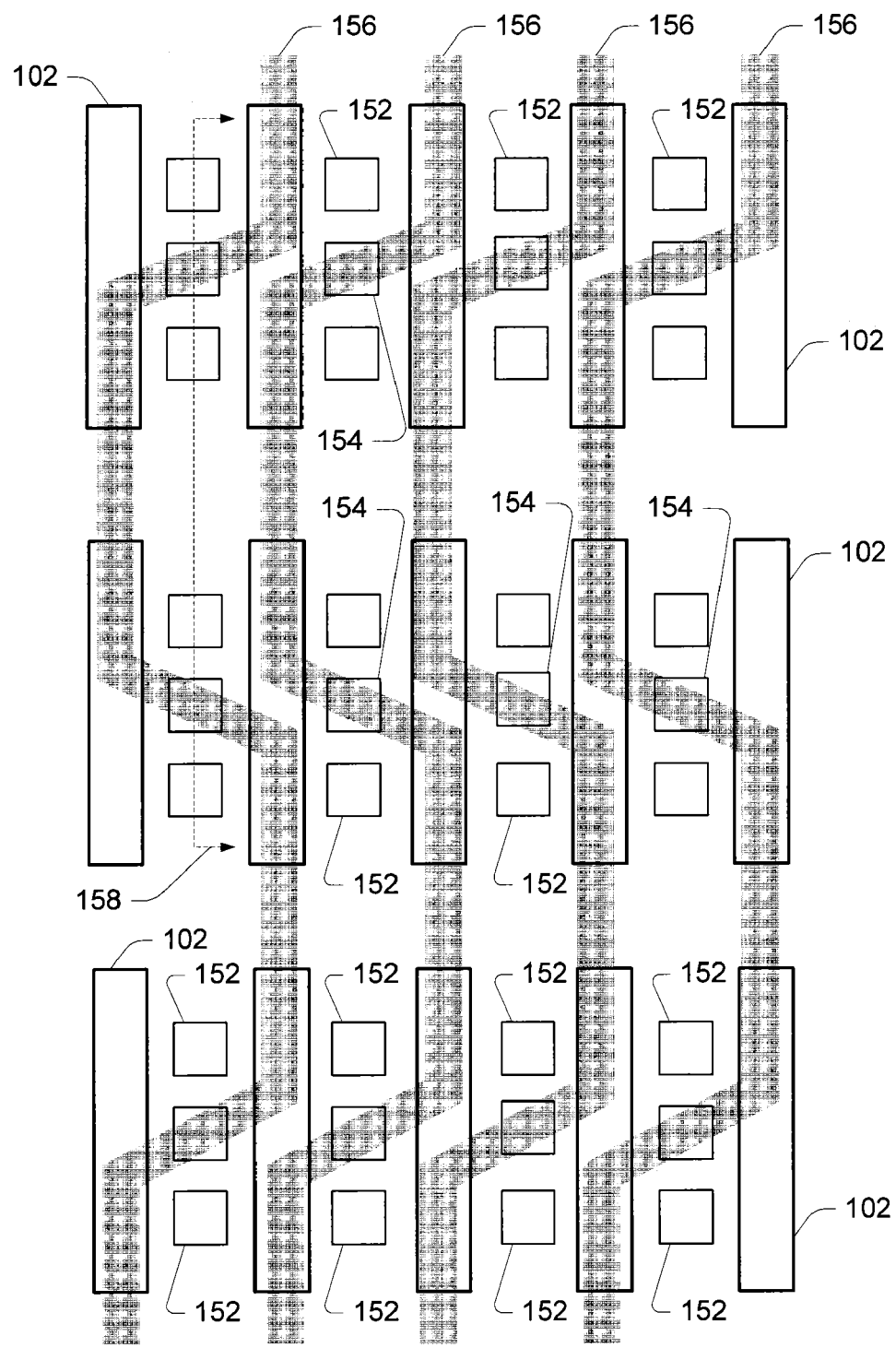
FIG. 9A is a top view of a portion of a memory array in accordance with one example embodiment of the routing of access lines.
Figure 9B:
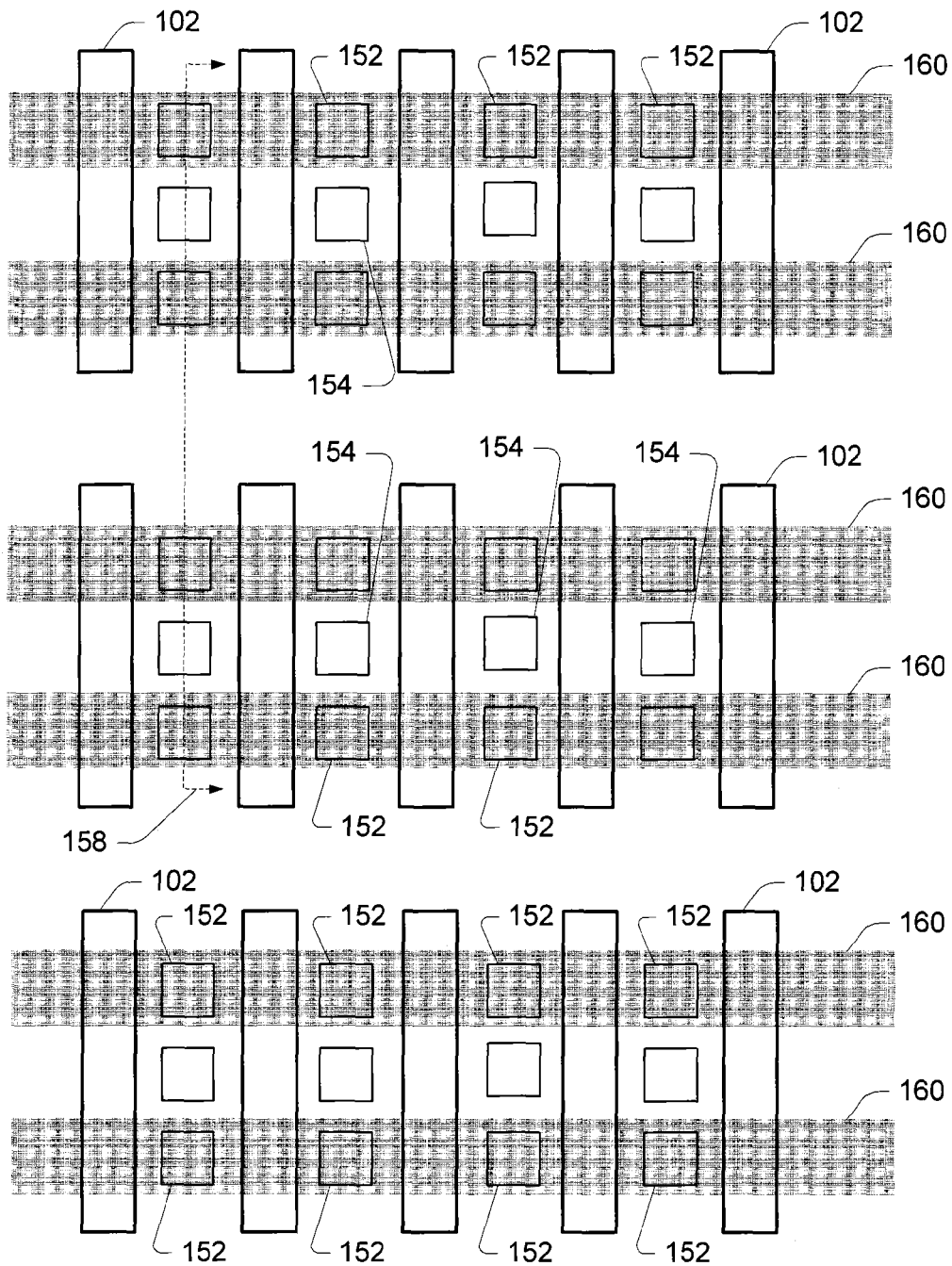
FIG. 9B is a top view of a portion of a memory array in accordance with one example embodiment of the routing of data lines.

In addition to individually biasing channel regions of the NAND strings, control gates and source/drain regions may similarly be selectively biased. FIG. 9A is a top view of a portion of the memory array 100 showing an example of the routing of access lines 156 (e.g., word lines) for connection to control gate contacts 154, which may represent an upper surface of conductors 138 or a contact plug or similar conductive structure (see, e.g., data line contacts 152 of FIG. 9C) connecting the conductors 138 to an access line 156. FIG. 9B is a top view of a portion of the memory array 100 showing an example of the routing of data lines 160 for connection to data line contacts 152 to connect to source/drain regions (semiconductor materials $122_n$ of the second conductivity type) of the NAND strings. The routing of access lines 156 shows a weaving pattern to permit the unobstructed formation of the data line contacts 152. Other patterns of access lines 156 and data lines 160 may be used provided that individual NAND strings may be accessed through appropriate decoding.

Figure 9C:
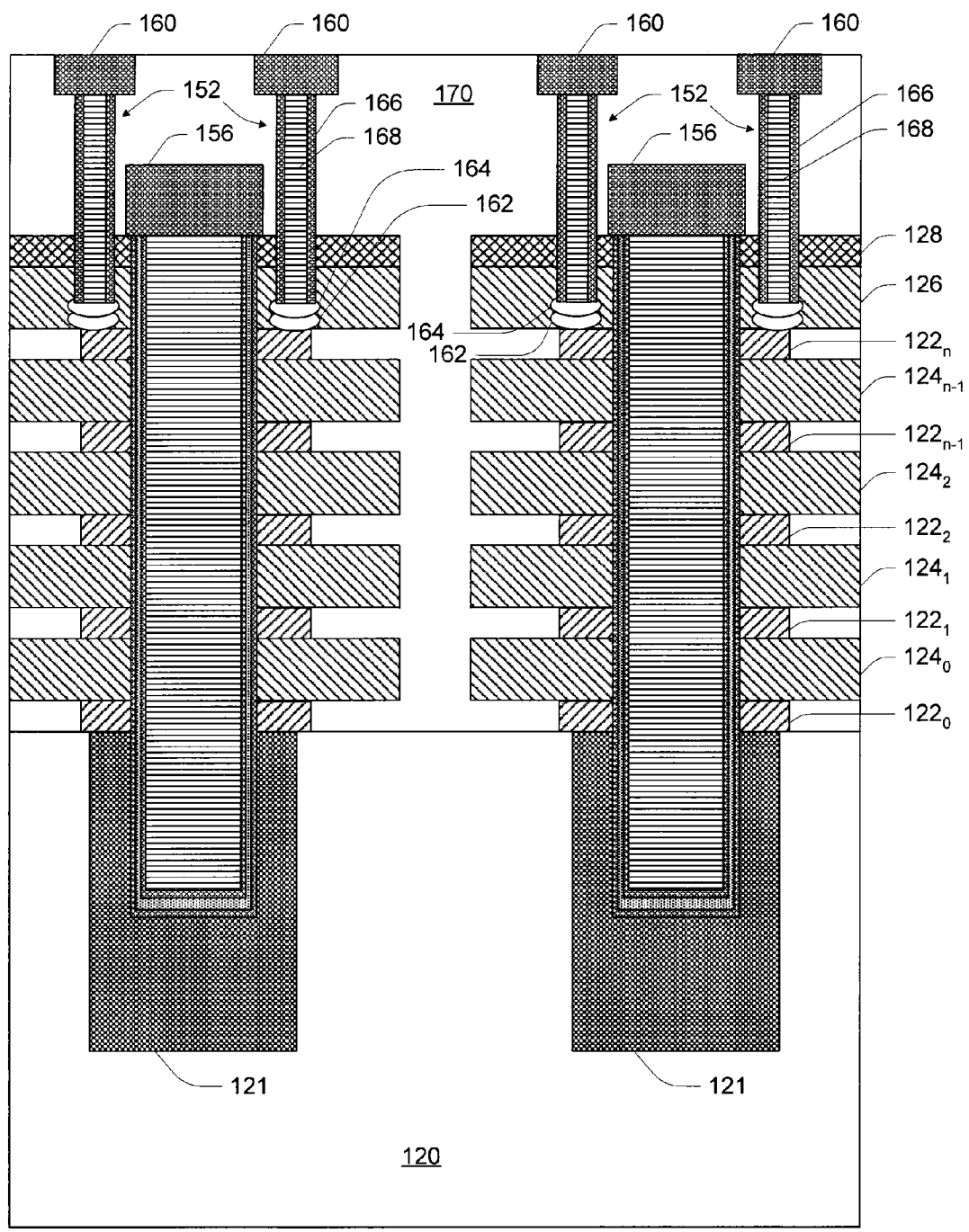
FIG. 9C is a cross-sectional view of a portion of the memory array showing the data lines and access lines in accordance with the embodiment depicted in FIGS. 9A-9B.

FIG. 9C is a cross-sectional view of a portion of the memory array 100 taken along view line 158 of FIGS. 9A and 9B. FIG. 9C depicts the access line 156 formed in contact with the conductors 138. FIG. 9C further depicts the data line contacts 152 extending to be in contact with a first region 162 of the second conductivity type and a second region 164 of the second conductivity type. The regions 162 and 164 of the second conductivity type provide connection between the data line contact 152 and the last source/drain region (semiconductor material $122_n$ of the second conductivity type in FIG. 9C) of an associated NAND string. The second region 164 of the second conductivity type may have a higher conductivity than the first region 162 of the second conductivity type, e.g., an $n^{++}$-type conductivity versus an $n^+$-type conductivity, thus providing a graded junction. While the data line contact 152 could extend to be in direct contact with the semiconductor material $122_n$ of the second conductivity type, it is believed that the graded junction will reduce the junction capacitance of the data line 160 and will additionally improve the breakdown voltage of the junction, thus allowing higher voltages to be applied. Formation of the data line contacts 152 may follow the guidance with respect to the channel contacts 140, i.e., formation of contact holes, formation of dielectric spacers 166 on sidewalls of the contact holes, and filling a remainder of the contact holes with one or more conductive materials 168. Formation of the access lines 156 and data lines 160 may follow the guidance with respect to conductor 138, i.e., access lines 156 and data lines 160 generally contain one or more conductive materials.

Figure 10:
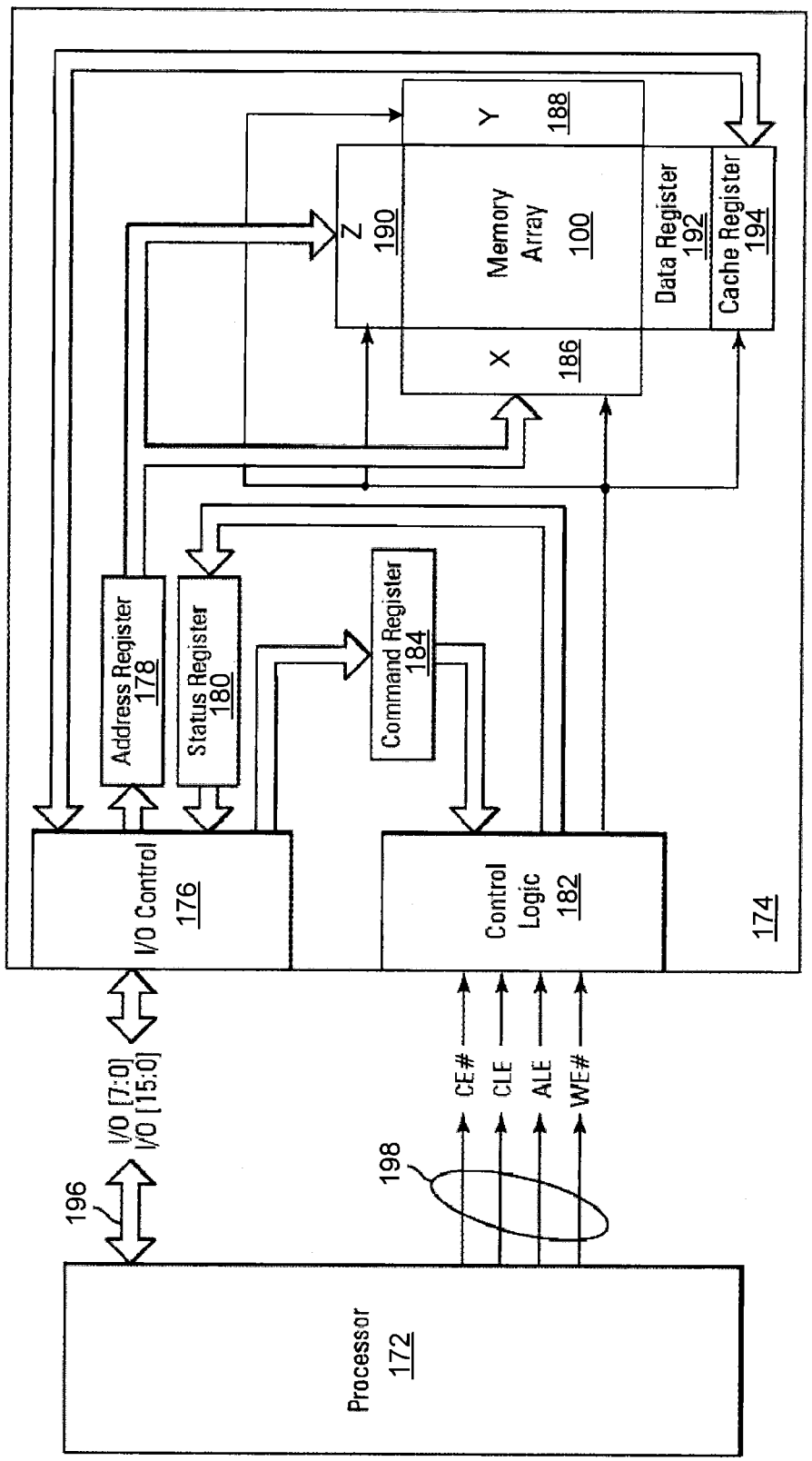
FIG. 10 is a simplified block diagram of a memory device coupled to a processor as part of an electronic system, according to an embodiment of the disclosure.

FIG. 10 is a simplified block diagram of a memory device 174, as one example of an integrated circuit device, in communication with (e.g., coupled to) a processor 172 as part of an electronic system, according to an embodiment of the disclosure. Some examples of electronic systems include personal computers, personal digital assistants (PDAs), digital cameras, digital media players, digital recorders, games, appliances, vehicles, wireless devices, cellular telephones and the like. The processor 172 may be, for example, a memory controller or other external processor for use in the control and access of the memory device 174.

Memory device 174 includes an array of memory cells 100. This memory array 100 has an architecture in accordance with an embodiment of the disclosure utilizing NAND strings of serially-connected non-volatile memory cells sharing a common control gate.

A first decode circuitry (e.g., X decoder) 186, a second decode circuitry (e.g., Y decoder) 188, and a third decode circuitry (e.g., Z decoder) 190 are provided to decode address signals. Address signals are received and decoded to access memory array 100. The first decode circuitry 186 is used to apply appropriate bias conditions to the various channel regions of the NAND strings during access operations. The second decode circuitry 188 is used to apply appropriate bias conditions to various access lines during access operations. The third decode circuitry 190 is used to apply appropriate bias conditions to various data lines during access operations and select data lines for sensing. Access operations include read operations (including verify operations), write operations and erase operations.

Memory device 174 also includes input/output (I/O) control circuitry 176 to manage input of commands, addresses and data to the memory device 174 as well as output of data and status information from the memory device 174. An address register 178 is coupled between I/O control circuitry 176 and first decode circuitry 186, second decode circuitry 188 and third decode circuitry 190 to latch the address signals prior to decoding. A command register 184 is coupled between I/O control circuitry 176 and control logic 182 to latch incoming commands. Control logic 182 controls access to the memory array 100 in response to the commands and generates status information for the external processor 172. The control logic 182 is coupled to first decode circuitry 186, second decode circuitry 188 and third decode circuitry 190 to control the first decode circuitry 186, second decode circuitry 188 and third decode circuitry 190 in response to the addresses.

Control logic 182 is also coupled to a cache register 194. Cache register 194 latches data, either incoming or outgoing, as directed by control logic 182 to temporarily store data while the memory array 100 is busy writing or reading, respectively, other data. During a write operation, data is passed from the cache register 194 to data register 192 for transfer to the memory array 100; then new data is latched in the cache register 194 from the I/O control circuitry 176. During a read operation, data is passed from the cache register 194 to the I/O control circuitry 176 for output to the external processor 172; then new data is passed from the data register 192 to the cache register 194. A status register 180 is coupled between I/O control circuitry 176 and control logic 182 to latch the status information for output to the processor 172.

Memory device 174 receives control signals at control logic 182 from processor 172 over a control link 198. The control signals may include, for example, a chip enable CE#, a command latch enable CLE, an address latch enable ALE, and a write enable WE#. Memory device 174 receives command signals (which represent commands), address signals (which represent addresses), and data signals (which represent data) from processor 172 over a multiplexed input/output (I/O) bus 196 and outputs data to processor 172 over I/O bus 196.

Specifically, the commands are received over input/output (I/O) pins [7:0] of I/O bus 196 at I/O control circuitry 176 and are written into command register 184. The addresses are received over input/output (I/O) pins [7:0] of bus 196 at I/O control circuitry 176 and are written into address register 178. The data are received over input/output (I/O) pins [7:0] for an 8-bit device or input/output (I/O) pins [15:0] for a 16-bit device at I/O control circuitry 176 and are written into cache register 194. The data are subsequently written into data register 192 for programming memory array 100. For another embodiment, cache register 194 may be omitted, and the data are written directly into data register 192. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 10 has been simplified. It should be recognized that the functionality of the various block components described with reference to FIG. 10 may not necessarily be segregated to distinct components or component portions of an integrated circuit device. For example, a single component or component portion of an integrated circuit device could be adapted to perform the functionality of more than one block component of FIG. 10. Alternatively, one or more components or component portions of an integrated circuit device could be combined to perform the functionality of a single block component of FIG. 10.

Additionally, while specific I/O pins are described in accordance with popular conventions for receipt and output of the various signals, it is noted that other combinations or numbers of I/O pins may be used in the various embodiments.

CONCLUSION

Memory devices have been described utilizing NAND strings of serially-connected non-volatile memory cells. The strings include two or more serially connected memory cells each having a channel region. Each memory cell of the two or more serially connected memory cells shares a common control gate and each memory cell of the two or more serially connected memory cells is configured to receive an individual bias to its channel region. The memory cells of such a string can have channel regions formed of a first semiconductor material of a first conductivity type and source/drain regions formed of a second semiconductor material of a second conductivity type. Accessing the memory cells of string can include individually biasing the channel regions of the memory cells while receiving a common control gate bias.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof

What is claimed is:

1. A string of memory cells, comprising:
two or more serially connected memory cells each having a channel region;
wherein the two or more serially connected memory cells share a control gate that is common to each of the two or more serially connected memory cells; and
wherein each memory cell of the two or more serially connected memory cells is configured to receive an individual bias to its channel region.

2. The string of claim 1, further comprising:
wherein the channel regions are formed of semiconductor material of a first conductivity type;
wherein the channel regions are separated from each other by source/drain regions formed of semiconductor material of a second conductivity type.

3. The string of claim 2, wherein the semiconductor material of the first conductivity type is a different semiconductor material than the semiconductor material of the second conductivity type.

4. The string of claim 2, wherein the semiconductor material of the first conductivity type forming one of the channel regions further forms a channel region of a memory cell of at least one additional string of serially-connected memory cells.

5. The string of claim 2, wherein each channel region is formed of the same semiconductor material of the first conductivity type and each source/drain region is formed of the same semiconductor material of the second conductivity type.

6. The string of claim 5, wherein each channel region is formed of semiconductor material of the first conductivity type having a first chemical composition and each source/drain region is formed of semiconductor material of the second conductivity type having a second chemical composition, wherein the first chemical composition is different than the second chemical composition.

7. The string of claim 6, wherein the semiconductor material of the first conductivity type is a p-type polysilicon and wherein the semiconductor material of the second conductivity type is an n-type epitaxial silicon doped with germanium.

8. The string of claim 7, wherein the epitaxial silicon doped with germanium is a silicon-germanium alloy.

9. The string of claim 1, wherein the two or more serially connected memory cells are formed vertically over a source region of the second conductivity type.

10. The string of claim 1, wherein the two or more serially connected memory cells share a discrete charge storage node adapted to store charge locally.

11. The string of claim 10, wherein discrete charge storage node comprises a plurality of discrete formations of conductive material capable of storing a charge and wherein the discrete charge storage node does not form a contiguous conductive entity.

12. The string of claim 1, wherein the string is a NAND string of non-volatile memory cells.

13. A string of serially-connected memory cells, comprising:
an alternating structure of semiconductor materials of a first conductivity type and semiconductor materials of a second conductivity type formed vertically, wherein the alternating structure comprises instances of semiconductor material of the first conductivity type and instances of semiconductor material of the second conductivity type;
a discrete charge storage node adjacent a sidewall of the alternating structure;
a conductor adjacent the discrete charge storage node;
a first dielectric between the discrete charge storage node and the sidewall of the alternating structure; and
a second dielectric between the discrete charge storage node and the conductor;
wherein the instances of semiconductor material of the first conductivity type form channel regions of the serially-connected memory cells;
wherein the instances of semiconductor material of the second conductivity type form source/drain regions of the serially-connected memory cells; and
wherein the conductor forms a common control gate of the serially-connected memory cells.

14. The string of claim 13, wherein the string comprises N serially-connected memory cells, wherein the alternating structure comprises N instances of semiconductor material of the first conductivity type and N+1 instances of semiconductor material of the second conductivity type, and wherein N is some integer value greater than one.

15. The string of claim 13, further comprising:
a source region of the second conductivity type connected to the first instance of the semiconductor materials of the second conductivity type of the alternating structure; and
a data line connected to a last instance of the semiconductor materials of the second conductivity type of the alternating structure.

16. The string of claim 13, further comprising:
an access line connected to the conductor.

17. The string of claim 13, further comprising:
a plurality of channel contacts connected in a one-to-one relationship to the instances of semiconductor material of the first conductivity type of the alternating structure.

18. A memory array, comprising:
a first string of N serially-connected memory cells, wherein N is some integer value greater than one, the first string comprising:
a control gate;
a discrete charge storage node;
an alternating structure of semiconductor materials of a first conductivity type and semiconductor materials of a second conductivity type, wherein the alternating structure comprises N instances of semiconductor material of the first conductivity type and N+1 instances of semiconductor material of the second conductivity type;
a first dielectric between the discrete charge storage node and the alternating structure; and
a second dielectric between the discrete charge storage node and the control gate; and
a second string of N serially-connected memory cells, the second string comprising:
a control gate;
a discrete charge storage node;
an alternating structure of semiconductor materials of the first conductivity type and semiconductor materials of the second conductivity type, wherein the alternating structure comprises N instances of semiconductor material of the first conductivity type and N+1 instances of semiconductor material of the second conductivity type;
a first dielectric between the discrete charge storage node and the alternating structure; and
a second dielectric between the discrete charge storage node and the control gate;
wherein the control gate of the first string and the control gate of the second string are a common conductor.

19. The memory array of claim 18, wherein the semiconductor materials of the first conductivity type are a p-type polysilicon and wherein the semiconductor materials of the second conductivity type are an n-type epitaxial silicon doped with germanium.

20. The memory array of claim 18, further comprising a semiconductor region having the second conductivity type connected to a first instance of the semiconductor material of the second conductivity type of the alternating structure of the first string of N serially-connected memory cells and connected to a first instance of the semiconductor material of the second conductivity type of the alternating structure of the second string of N serially-connected memory cells.

21. The memory array of claim 20, wherein the common conductor extends below an upper surface of the semiconductor region having the second conductivity type, and wherein the common conductor is isolated from the semiconductor region having the second conductivity type by the first and second dielectrics.

22. The memory array of claim 20, further comprising a first data line connected to a last instance of the semiconductor material of the second conductivity type of the alternating structure of the first string of N serially-connected memory cells, and a second data line connected to a last instance of the semiconductor material of the second conductivity type of the alternating structure of the second string of N serially-connected memory cells.

23. The memory array of claim 18, wherein each instance of semiconductor material of the first conductivity type of the alternating structure of the first string of N serially-connected memory cells is isolated from each instance of semiconductor material of the first conductivity type of the alternating structure of the second string of N serially-connected memory cells, and wherein each instance of semiconductor material of the first conductivity type of the alternating structure of the first string of N serially-connected memory cells is shared with at least one other string of N serially-connected memory cells.

24. The memory array of claim 18, wherein the alternating structure of the first string of N serially-connected memory cells is isolated from the alternating structure of the second string of N serially-connected memory cells.

25. A memory array, comprising:
a first string of N serially-connected memory cells, wherein N is some integer value greater than one, the first string comprising:
a control gate;
a discrete charge storage node;
an alternating structure of semiconductor materials of a first conductivity type and semiconductor materials of a second conductivity type, wherein the alternating structure comprises N instances of semiconductor material of the first conductivity type and N+1 instances of semiconductor material of the second conductivity type;
a first dielectric between the discrete charge storage node and the alternating structure; and
a second dielectric between the discrete charge storage node and the control gate; and
a second string of N serially-connected memory cells, the second string comprising:
a control gate;
a discrete charge storage node;
an alternating structure of semiconductor materials of the first conductivity type and semiconductor materials of the second conductivity type, wherein the alternating structure comprises N instances of semiconductor material of the first conductivity type and N+1 instances of semiconductor material of the second conductivity type;
a first dielectric between the discrete charge storage node and the alternating structure; and
a second dielectric between the discrete charge storage node and the control gate;
wherein the alternating structure of the first string of N serially-connected memory cells and the alternating structure of the second string of N serially-connected memory cells share the N instances of semiconductor material of the first conductivity type.

26. The memory array of claim 25, wherein the semiconductor materials of the first conductivity type are a p-type polysilicon and wherein the semiconductor materials of the second conductivity type are an n-type epitaxial silicon doped with germanium.

27. The memory array of claim 25, further comprising:
a third string of N serially-connected memory cells, the third string comprising:
a control gate;
a discrete charge storage node;
an alternating structure of semiconductor materials of the first conductivity type and semiconductor materials of the second conductivity type, wherein the alternating structure comprises N instances of semiconductor material of the first conductivity type and N+1 instances of semiconductor material of the second conductivity type;
a first dielectric between the discrete charge storage node and the alternating structure; and
a second dielectric between the discrete charge storage node and the control gate;
wherein the control gate of the second string and the control gate of the third string are a common conductor; and
wherein the control gate of the second string and the control gate of the first string are different conductors.

28. A method of accessing a string of serially-connected memory cells, the method comprising:
biasing a control gate common to each memory cell of the string of serially-connected memory cells;
biasing a data line connected to a source/drain region of a memory cell at one end of the string of serially-connected memory cells; and
individually biasing channel regions of the string of serially-connected memory cells, wherein the channel regions of adjacent memory cells of the string of serially-connected memory cells are discrete formations of semiconductor material.

29. The method of claim 28, wherein biasing the control gate comprises biasing the control gate to some potential between a threshold voltage range representative of a first data value and a threshold voltage range representative of a second data value.

30. The method of claim 29, wherein individually biasing channel regions of the string of serially-connected memory cells further comprises biasing a channel region of a target memory cell to a ground potential.

31. The method of claim 28, wherein individually biasing channel regions of the string of serially-connected memory cells further comprises biasing a channel region of a target memory cell to a potential such that the target memory cell is activated if the target memory cell has a first data value while the control gate receives its bias and deactivated if the target memory cell has a second data value while the control gate receives its bias.

32. The method of claim 31, wherein individually biasing channel regions of the string of serially-connected memory cells further comprises biasing channel regions of remaining memory cells of the string of serially-connected memory cells to a potential such that each of the remaining memory cells is activated while the control gate receives its bias regardless of their respective data values.

33. The method of claim 32, further comprising sensing a voltage change on a data line connected to one end of the string of serially-connected memory cells to determine the data value of the target memory cell.

34. The method of claim 28, wherein accessing the string of serially-connected memory cells comprises an access operation selected from the group consisting of a read operation, a write operation and an erase operation.

35. A method of forming a string of serially-connected memory cells, the method comprising:
 forming a region of a second conductivity type in a semiconductor material of a first conductivity type;
 forming an alternating structure of semiconductor materials of the second conductivity type and semiconductor materials of the first conductivity type, wherein the alternating structure comprises instances of semiconductor material of the first conductivity type and instances of semiconductor material of the second conductivity type, and wherein a first instance of semiconductor material of the second conductivity type is connected to the region of the second conductivity type;
 forming a subsequent semiconductor material of the first conductivity type on the alternating structure;
 forming a protective dielectric on the subsequent semiconductor material of the first conductivity type;
 forming a trench through the protective dielectric and into the region of the second conductivity type;
 forming a first dielectric on surfaces of the trench;
 forming a discrete charge storage node on the first dielectric;
 forming a second dielectric on the discrete charge storage node;
 forming a conductor to fill a remainder of the trench;
 forming isolation regions orthogonal to the conductor; and
 selectively removing portions of the instances of semiconductor material of the second conductivity type of the alternating structure to define discrete source/drain regions for the memory cells of the string of serially-connected memory cells.

36. The method of claim 35, wherein forming an alternating structure of semiconductor materials of the second conductivity type and semiconductor materials of the first conductivity type comprises:
 forming a first instance of semiconductor material of the second conductivity type on the region of the second conductivity type;
 forming a first instance of semiconductor material of the first conductivity type on the first instance of semiconductor material of the second conductivity type;
 forming N−1 subsequent instances of semiconductor material of the second conductivity type and semiconductor material of the first conductivity type in a repeating pattern; and
 forming an $N+1^{th}$ instance of semiconductor material of the second conductivity type on an $N^{th}$ instance of semiconductor material of the first conductivity type;
 wherein N is an integer value greater than one.

37. The method of claim 36, wherein forming isolation regions orthogonal to the conductor comprises forming the isolation regions extending below a level of the conductor and above a bottom of the region of the second conductivity type.

38. The method of claim 35, wherein forming a discrete charge storage node on the first dielectric comprises forming discrete formations of conductive material on the first dielectric.

39. The method of claim 38, wherein forming discrete formations of conductive material on the first dielectric comprises forming metal-containing nanodots on the first dielectric.

40. The method of claim 35, wherein selectively removing portions of the instances of semiconductor material of the second conductivity type of the alternating structure comprises:
 forming access holes to expose surfaces of the instances of semiconductor material of the first conductivity type of the alternating structure and instances of semiconductor material of the second conductivity type of the alternating structure; and
 performing an isotropic removal process selective to the semiconductor material of the second conductivity type over the semiconductor material of the first conductivity type.

* * * * *